(12) United States Patent
Hayase et al.

(10) Patent No.: US 6,259,293 B1
(45) Date of Patent: Jul. 10, 2001

(54) DELAY CIRCUITRY, CLOCK GENERATING CIRCUITRY, AND PHASE SYNCHRONIZATION CIRCUITRY

(75) Inventors: Kiyoshi Hayase; Kouichi Ishimi, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/413,528

(22) Filed: Oct. 6, 1999

(30) Foreign Application Priority Data

Jun. 15, 1999 (JP) .................................................. 11-168809

(51) Int. Cl.[7] .................................................. H03H 11/26
(52) U.S. Cl. ......................... 327/276; 327/158; 327/161; 327/270
(58) Field of Search ..................................... 327/149, 161, 327/152, 156, 147, 158, 270, 277, 276

(56) References Cited

U.S. PATENT DOCUMENTS

| 4,494,021 | * | 1/1985 | Bell et al. ............................. 327/270 |
| 6,064,271 | * | 5/2000 | Okubo et al. ............................. 331/2 |

FOREIGN PATENT DOCUMENTS 59-63822 * 4/1984 (JP) .

OTHER PUBLICATIONS

Kouichi Ishimi et al., "A Full–Digital PLL for Low Voltage LSIs", TechNical Report of IEICE., vol. 97, No. 106, pp. 29–36, Jun. 1997.*

Michel Combes et al., "A Portable Clock Multiplier Generator Using Digital CMOS Standard Cells", IEEE Journal of Solid–State Circuits, vol. 13, No. 7, Jul. 1996.(with English Abstract and Statement of Relevance).*

Ian A. Young et al., "A PLL Clock Generator with 5 to 110 MHz of Lock Range for Microprocessors", IEEE Journal of Solid–State Circuits, vol. SC–27, pp. 1599–1607, Nov. 1992.*

* cited by examiner

*Primary Examiner*—Toan Tran
*Assistant Examiner*—Cassandra Cox
(74) *Attorney, Agent, or Firm*—Burns, Doane, Swecker & Mathis, LLP

(57) ABSTRACT

Delay circuitry includes a phase-locked loop or PLL for comparing the phase of a reference clock applied thereto with that of another clock to be compared to generate a control signal having a value corresponding to the phase difference between the phases of the reference clock and other clock, for generating the other clock using at least a plurality of delay elements connected into a loop, a time delay provided by each of the plurality of delay elements being controlled by the control signal, and for changing the value of the control signal so that the other clock is made to be in phase with the reference clock. The delay circuitry further includes a register for storing information to set a certain time delay, and a delay unit including a plurality of delay elements each of which provides an input with a time delay that is controlled by the control signal from the PLL, for determining the number of delay elements through which an input signal is to be passed according to the information stored in the register, so as to provide the input signal with the predetermined time delay.

20 Claims, 13 Drawing Sheets

DELAY CIRCUITRY, CLOCK GENERATING CIRCUITRY, AND PHASE SYNCHRONIZATION CIRCUITRY

BACKGROUND OF THE INVENTION

1. Field of the Invention

The present invention relates to delay circuitry for delaying an input signal such as a clock, clock generating circuitry for generating a clock, and phase synchronization circuitry for bringing an input clock into synchronization with a reference signal.

2. Description of the Prior Art

Referring now to FIG. 13, there is illustrated a block diagram showing the structure of prior art clock generating circuitry (or phase synchronization circuitry) for generating an output clock in synchronization with an input clock using a phase locked loop or PLL, the frequency of the output clock being either the same as or multiple times as large as that of the input clock. In the figure, reference numeral 1 denotes a voltage-controlled oscillator or VCO, 3 denotes a frequency divider for dividing an output clock from the VCO 1, the output clock having a frequency that is multiple times as large as that of the input clock, 4 denotes an oscillator for generating a reference clock as an input clock, 6 denotes a charge pump for comparing the phase of the frequency-divided clock from the frequency divider 3 with that of the reference clock from the oscillator 4 and for generating and furnishing a control voltage having a value corresponding to the difference between the phases of the frequency-divided clock and reference clock to make them in phase with each other, 8 denotes an inverter included in the VCO 1, and 9 denotes a PLL.

In operation, the VCO 1 generates an output clock having a frequency that is n-times as large as that of the reference clock, and then furnishes the output clock to the frequency divider 3 as well as to outside the clock generating circuitry. The frequency divider 3 divides the frequency of the output clock to generate and furnish a frequency-divided clock to the charge pump 6. The charge pump 6 then compares the phase of the frequency-divided clock from the frequency divider 3 with that of the reference clock from the oscillator 4 and generates a control signal having a value corresponding to the phase difference between the phases of the frequency-divided clock and reference clock to bring them into synchronization with each other. To be more specific, when the frequency-divided clock leads the reference clock, the charge pump 6 increases the value or voltage of the control signal. Otherwise, the charge pump 6 decreases the value or voltage of the control signal. When the frequency-divided clock from the frequency divider 3 is brought into synchronization with or made in phase with the reference clock from the oscillator 4, the PLL 9 brings itself into its locked state. When the PLL 9 makes a transition to its locked state, the frequency-divided clock, which has been obtained by dividing the output of the VCO 1 by n by means of the frequency divider 3, becomes equal to the reference clock in pulse repetition period.

The PLL 9 can include a plurality of dividers 3. In this case, the prior art clock generating circuitry makes it possible to change between frequency multiplication ratios and set the frequency multiplication ratio defined by the VCO to a desired one by selecting one frequency divider 3 from among the plurality of dividers according to the desired frequency multiplication ratio. For example, when the frequency multiplication ratio selected is 1:n, the PLL 9 generates an output clock having a frequency that is n-times as large as that of the reference clock. Furthermore, the prior art clock generating circuitry can include a plurality of oscillators 4. The clock generating circuitry can change the frequency of the reference clock by selecting one oscillator 4 from among the plurality of oscillators. The clock generating circuitry thus can change the pulse repetition rate of the output clock by switching between the plurality of dividers 3 and/or switching between the plurality of oscillators 4. However, when carrying out such switching, there is a need to bring the PLL into its locked state again because the switching brings the PLL into its unlocked state, thus increasing the time required for changing the pulse repetition period of the output clock. In order to reduce the time required for changing the pulse repetition period of the output clock, a prior art method is disclosed, the method comprising the steps of generating a plurality of clocks having difference pulse repetition periods using a plurality of oscillators 4 and a plurality of PLLs 9, as shown in FIG. 14, and selecting one clock from among the plurality of clocks using a multiplexer 10. However, this prior art method has no alternative but to increase the size of the circuitry in order to adjust the pulse repetition period of the output clock over a wide range and in steps of a fine time step. In addition, the prior art method suffers from a drawback that changing the pulse repetition period of the output clock causes a phase shift or the like and hence a jitter in the output clock.

Referring next to FIG. 15, there is illustrated a block diagram showing the structure of an example of prior art delay circuitry capable of adjusting a time delay that the circuitry provides for an input. In the figure, reference numeral 11 denotes an inverter, 12 denotes a multiplexer, 19 denotes a register, and 46 denotes the delay circuitry. As shown in FIG. 15, the delay circuitry 46 includes a plurality of inverters 11 connected in series, the number of inverters 11 being even. The plurality of inverters 11 in series are divided into a plurality of sets each including two inverters, and a plurality of lead lines disposed at intervals of one set of two inverters and two other lead lines from two ends of the series of plural inverters 11 are connected to the multiplexer 12. The multiplexer 12 can change the time delay by selecting one lead line from among the plurality of lead lines according to the contents of the register 19. The use of a PLL including the delay circuitry as shown in FIG. 15 makes it possible to adjust the pulse repetition period of an output clock. However, this method has a disadvantage that it cannot change the time delay in steps of an arbitrary time step other than the time step determined by a gate delay, the time delay may change due to a change in the ambient temperature or a change in the voltage of a power supply, and therefore it cannot change the pulse repetition period of the output clock in steps of a precise time step.

Referring next to FIG. 16, there is illustrated a block diagram showing the structure of other prior art delay circuitry, in which a plurality of delay circuits are connected in series in order to adjust the time delay provided by the delay circuitry over a wide range and in steps of a fine time step. As shown in FIG. 16, when two delay circuits 46a and 46b are connected in series, for example, the first delay circuit 46a can be so constructed as to adjust the time delay in steps of a small time step and the second delay circuit 46b can be so constructed as to adjust the time delay in steps of a large time step. The time delays provided by the first and second delay circuits 46a and 46b are defined by lower and upper bits of the register 19, respectively. In this case, the first delay circuit 46a can have eight time delay settings, and, when the time delay provided by any two inverters 11 in the first delay circuit 46a is Δd and the time delay provided by any two inverters 11 in the second delay circuit 46b is ΔD, ΔD must be equal to (Δd×8). It is, however, impossible to make ΔD equal to (Δd×8) at all times because of a change in the voltage of a power supply or a change in the ambient temperature, or a variation in the manufacturing process. Unless ΔD is equal to (Δd×8) at all times, the smallest change in the time delay provided by the delay circuitry can become greater than Δd. Furthermore, there is a possibility that even though the contents of the register 19 are varied so that the delay time is increased, the delay time actually decreases.

Referring next to FIG. 17, there is illustrated a block diagram showing the structure of other prior art delay circuit as disclosed in Japanese Patent Application Publication (KOKAI) No. 59-63822, for example. In the figure, reference numeral 50 denotes a phase/frequency comparator for comparing the phase or frequency of a reference clock applied thereto with that of a frequency-divided clock from a frequency divider 3, and 51 denotes a loop filter and level shifter for generating a control signal from the output of the phase/frequency comparator 50, and for furnishing the control signal to a VCO 1 and a delay line 53.

In operation, the VCO 1 furnishes its output to the frequency divider 3, and the frequency divider 3 divides the frequency of the output. The frequency divider 3 then furnishes a frequency-divided clock to the phase/frequency comparator 50. The phase/frequency comparator 50 compares the phase or frequency of the frequency-divided clock with that of the reference clock. The phase/frequency comparator 50 then furnishes its output to the loop filter and level shifter 51. The loop filter and level shifter 51 furnishes a control signal to the delay line 53. The control signal has a value that indicates the phase difference between the phases of the reference clock and frequency-divided clock, and that varies according to the pulse signal from the phase/frequency comparator 50. The control signal is also applied to the delay line 53. The time delay provided by the delay line 53 is thus set to a predetermined value according to the control signal.

A problem with the prior art clock generating circuitry as shown in FIG. 13 is that since the PLL included in the circuitry defines the pulse repetition period of the output clock based on the frequency multiplication of the input clock and the frequency division of the frequency-multiplied clock, it cannot adjust the pulse repetition period of the output clock over a wide range and in steps of a fine time step.

A problem with the prior art delay circuitry as shown in FIG. 15 is that since the time delay may change due to a variation in the manufacturing process or a change in environmental factors, it cannot precisely define the time delay in steps of a certain time step, thus not being able to provide clock generating circuitry that can precisely set the pulse repetition period and phase of the output clock in steps of a certain time step.

A problem with the other prior art delay circuitry as shown in FIG. 16, in which a plurality of delay circuits are connected in series to adjust the time delay provided by the delay circuitry over a wide range and in steps of a fine time step, is that since it is impossible to keep the time delay provided by each delay circuit constant at all times because of a change in the voltage of a power supply or a change in the ambient temperature, or a variation in the manufacturing process, the smallest change in the time delay provided by the delay circuitry can become greater than its original value and there is a possibility that a control performed for the time delay to increase conversely decreases the time delay.

A problem with the other prior art delay circuitry as shown in FIG. 17 is that although it can prevent the time delay from changing due to a variation in the manufacturing process or a change in environmental factors by forming each delay element included in the delay line 53 in the same manner that each delay element included in the VCO 1 is formed, it cannot freely change the time delay in steps of a time step.

SUMMARY OF THE INVENTION

The present invention is made to overcome the above problems. It is therefore an object of the present invention to provide delay circuitry capable of precisely, freely changing the time delay in steps of a certain time step regardless of a variation in the manufacturing process or a change in environmental factors, clock generating circuitry capable of precisely changing the pulse repetition period and phase of an output clock in steps of a certain time step using the delay circuitry, and phase synchronization circuitry capable of precisely changing the phase of an output clock in steps of a certain time step, and precisely bringing the output clock into synchronization with another clock.

In accordance with one aspect of the present invention, there is provided delay circuitry comprising: an oscillating unit for comparing the phase of a reference clock applied thereto with that of another clock to be compared to generate a control signal having a value corresponding to the phase difference between the phases of the reference clock and other clock, for generating the other clock using at least a plurality of delay elements connected into a loop, a time delay provided by each of the plurality of delay elements being controlled by the control signal, and for changing the value of the control signal so that the other clock is made to be in phase with the reference clock; a storage unit for storing information to set a predetermined time delay; and a delay unit including a plurality of delay elements each of which provides an input with a time delay that is controlled by the control signal from the oscillating unit, for determining the number of delay elements through which an input signal is to be passed according to the information stored in the storage unit, so as to provide the input signal with the predetermined time delay. Thus, the delay circuitry can precisely control the time delay in steps of a predetermined time step. Even though the time delay provided by the delay unit varies due to a change in the ambient temperature or a change in the voltage of a power supply, the same change occurs in the oscillating unit to make the oscillating unit operate to reduce the phase difference caused by the change between the phases of the clock generated by the oscillating unit and reference clock to zero, and therefore the time delay provided to the input signal by the delay unit immediately, easily return to a desired set value.

Preferably, the plurality of delay elements included in the oscillating unit are manufactured in the same semiconductor process that the plurality of delay elements included in the delay unit are manufactured. Variations in the manufacturing process do not cause a change in the time delay from the desired set value.

In accordance with a preferred embodiment of the present invention, the delay circuitry can comprise a plurality of delay circuits connected in series, each of which includes the oscillating unit, the storage unit, and the delay unit, and each of the plurality of delay circuits can change the predetermined delay time to be provided to an input applied thereto in steps of a different time step. The delay circuitry can thus change the time delay to be provided to the input signal over a wide range in steps of a fine time step. In each of the plurality of delay circuits, the plurality of delay elements included in the oscillating unit can be manufactured in the same semiconductor process that the plurality of delay elements included in the delay unit are manufactured.

In accordance with another aspect of the present invention, there is provided clock generating circuitry comprising: at least a delay circuit including an oscillating unit for comparing the phase of a reference clock applied thereto with that of another clock to be compared to generate a control signal having a value corresponding to the phase difference between the phases of the reference clock and other clock, for generating the other clock using at least a plurality of delay elements connected into a loop, a time delay provided by each of the plurality of delay elements being controlled by the control signal, and for changing the value of the control signal so that the other clock is made to be in phase with the reference clock, a storage unit for storing information to set a predetermined time delay, and a delay unit including a plurality of delay elements each of which provides an input with a time delay that is controlled by the control signal from the oscillating unit, for determining the number of delay elements through which an input signal is to be passed according to the information stored in the storage unit, so as to provide the input signal with the predetermined time delay; and a clock generating unit that forms a loop together with at least the delay circuit, for generating and furnishing a clock pulse having a certain basic pulse repetition period to the delay circuit, and for generating a clock having a predetermined pulse repetition period in cooperation with the delay circuit. Thus, the clock generating circuitry can precisely change the pulse repetition period of an output clock in steps of a predetermined time step. Even though the time delay provided by the delay unit in the delay circuit varies due to a change in the ambient temperature or a change in the voltage of a power supply, the same change occurs in the oscillating unit of the delay circuit to make the oscillating unit operate to reduce the phase difference caused by the change between the phases of the clock generated by the oscillating unit and reference clock to zero, and therefore the pulse repetition period of the output clock defined by the delay circuit immediately, easily return to a desired set value. Preferably, the plurality of delay elements included in the oscillating unit can be manufactured in the same semiconductor process that the plurality of delay elements included in the delay unit are manufactured.

In accordance with a preferred embodiment of the present invention, the clock generating circuitry comprises a plurality of delay circuits connected in series, each of which includes an oscillating unit for comparing the phase of a reference clock applied thereto with that of another clock to be compared to generate a control signal having a value corresponding to the phase difference between the phases of the reference clock and other clock, for generating the other clock using at least a plurality of delay elements connected into a loop, a time delay provided by each of the plurality of delay elements being controlled by the control signal, and for changing the value of the control signal so that the other clock is made to be in phase with the reference clock, a storage unit for storing information to set a predetermined time delay, and a delay unit including a plurality of delay elements each of which provides an input with a time delay that is controlled by the control signal from the oscillating unit, for determining the number of delay elements through which an input signal is to be passed according to the information stored in the storage unit, so as to provide the input signal with the predetermined time delay, each of the plurality of delay circuits being able to change a certain time delay to be provided to an input applied thereto in steps of a different time step. Further, the plurality of delay circuits can form a loop together with the clock generating unit. The clock generating circuitry can thus maintain a basic pulse repetition period of the output clock. In each of the plurality of delay circuits, the plurality of delay elements included in the oscillating unit can be manufactured in the same semiconductor process that the plurality of delay elements included in the delay unit are manufactured. Variations in the manufacturing process do not cause a change in the pulse repetition period of the output clock from a desired set value.

In accordance with another preferred embodiment of the present invention, the clock generating unit is a unit for inverting an output of the delay circuit that forms the loop together with the clock generating unit so as to generate the clock having the predetermined pulse repetition period in cooperation with the delay circuit.

In accordance with another preferred embodiment of the present invention, the clock generating unit includes a control unit for comparing the phase of a reference clock applied thereto with that of another clock to be compared to generate a control signal having a value corresponding to the phase difference between the phases of the reference clock and other clock, for generating the other clock using a first delay unit formed into a loop, a time delay provided by the delay unit being controlled by the control signal, and for changing the value of the control signal so that the other clock is made to be in phase with the reference clock, and a second delay unit for inverting an output of the delay circuit that forms the loop together with the clock generating unit and for providing the output with a time delay controlled by the control signal from the control unit so as to generate the clock having the predetermined pulse repetition period in cooperation with the delay circuit. The clock generating circuitry can thus maintain a basic pulse repetition period of the output clock, and precisely change the pulse repetition period of the output clock in steps of a certain time step.

Preferably, the control unit can include a plurality of delay elements connected in series, which are disposed as the first delay unit formed into a loop, a time delay provided by each of the plurality of delay elements being controlled by the control signal. Furthermore, the second delay unit of the clock generating unit can include a plurality of delay elements connected in series, a time delay provided by each of the plurality of delay elements being controlled by the control signal from the control unit. The clock generating circuitry can thus maintain a basic pulse repetition period of the output clock, and precisely change the pulse repetition period of the output clock in steps of a certain time step. Preferably, the plurality of delay elements included in the control unit can be manufactured in the same semiconductor process that the plurality of delay elements included in the second delay unit of the clock generating unit are manufactured. Variations in the manufacturing process do not cause a change in the pulse repetition period of the output clock from a desired set value.

As an alternative, the control unit can include a digital delay line, which is disposed as the first delay unit, a time delay provided by the digital delay line being controlled by the control signal. Furthermore, the second delay unit of the clock generating unit can include a digital delay line, a time delay provided by the digital delay line being controlled by the control signal from the control unit.

In accordance with another preferred embodiment of the present invention, the reference clock applied to at least one delay circuit has the same frequency as the reference clock applied to the clock generating unit. The clock generating circuitry can thus maintain a basic pulse repetition period of the output clock, and precisely change the pulse repetition period of the output clock in steps of a certain time step, by using only one reference clock.

In accordance with another preferred embodiment of the present invention, the clock generating circuitry further comprises at least another delay circuit for adjusting the phase of the clock having the predetermined pulse repetition period from the clock generating unit, the other delay circuit including an oscillating unit for comparing the phase of a reference clock applied thereto with that of another clock to be compared to generate a control signal having a value corresponding to the phase difference between the phases of the reference clock and other clock, for generating the other clock using at least a plurality of delay elements connected into a loop, a time delay provided by each of the plurality of delay elements being controlled by the control signal, and for changing the value of the control signal so that the other clock is made to be in phase with the reference clock, a storage unit for storing information to set a predetermined time delay, and a delay unit including a plurality of delay elements each of which provides an input with a time delay that is controlled by the control signal from the oscillating unit, for determining the number of delay elements through which an input signal is to be passed according to the information stored in the storage unit, so as to provide the clock from the clock generating unit with the predetermined time delay. The clock generating circuitry can thus maintain a basic pulse repetition period of the output clock, and precisely change the phase of the output clock over a wide range in steps of a fine time step.

In accordance with another aspect of the present invention, there is provided phase synchronization circuitry comprising: an oscillating unit for comparing the phase of a first reference clock applied thereto with that of another clock to be compared to generate a control signal having a value corresponding to the phase difference between the phases of the first reference clock and other clock, for generating the other clock using at least a plurality of delay elements connected into a loop, a time delay provided by each of the plurality of delay elements being controlled by the control signal, and for changing the value of the control signal so that the other clock is made to be in phase with the first reference clock; a storage unit for storing information to set a predetermined time delay; a delay unit including a plurality of delay elements each of which provides an input with a time delay that is controlled by the control signal from the oscillating unit, for changing the number of delay elements through which an input clock signal is to be passed, so as to provide the input clock signal with the predetermined time delay; and a phase synchronization unit for comparing the phase of a second reference clock applied thereto with that of an output clock signal from the delay unit, and for changing the information stored in the storage unit so that the second reference clock is made to be in phase with the output clock signal. Thus, the phase synchronization circuitry can precisely change the phase of an output clock in steps of a predetermined time step, thereby being able to bring the output clock into synchronization with another clock as needed. Even though the time delay provided by the delay unit varies due to a change in the ambient temperature or a change in the voltage of a power supply, the same change occurs in the oscillating unit to make the oscillating unit operate to reduce the phase difference caused by the change between the phases of the clock generated by the oscillating unit and reference clock to zero, and therefore the phase shift to be provided to the input clock, which is defined by the delay unit, immediately, easily return to a desired set value.

Preferably, the plurality of delay elements included in the oscillating unit can be manufactured in the same semiconductor process that the plurality of delay elements included in the delay unit are manufactured. Variations in the manufacturing process do not cause a change in the phase shift of the output clock from a desired set value.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
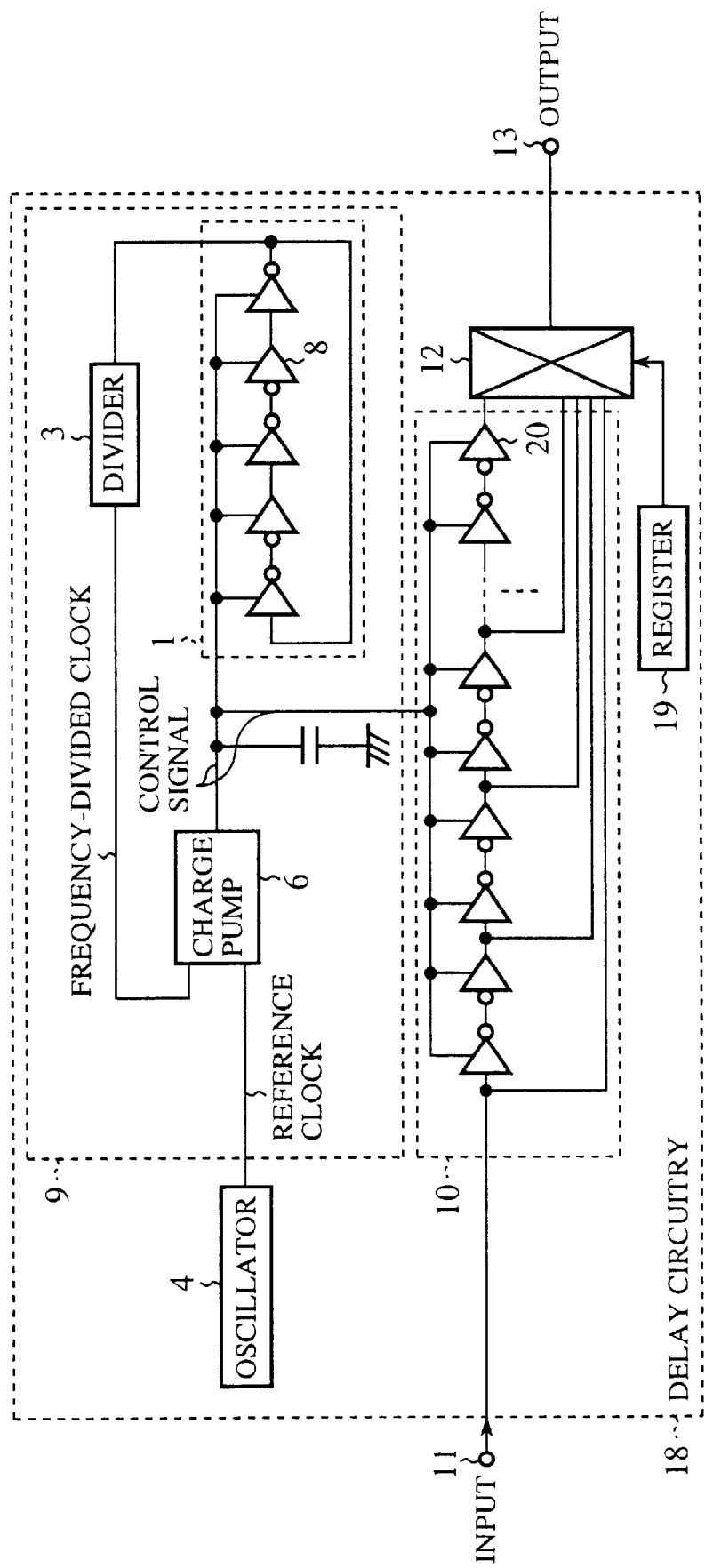
FIG. 1 is a block diagram showing the structure of delay circuitry according to a first embodiment of the present invention.

Referring next to FIG. 1, there is illustrated a block diagram showing the structure of delay circuitry according to a first embodiment of the present invention. In the figure, reference numeral 1 denotes a voltage-controlled oscillator or VCO, 4 denotes an oscillator for generating a reference clock, 6 denotes a charge pump for comparing the phase of the reference clock with that of an output of a frequency divider 3 so as to furnish a control signal having a value or voltage corresponding to the difference between the phases of the reference clock and output of the frequency divider 3 to the VCO 1, 8 denotes an inverter disposed in the VCO 1, 9 denotes a phase-locked loop or PLL comprised of the VCO 1 including a plurality of inverters 8 connected in series and in a loop, the charge pump 6, and the frequency divider 3, 11 denotes an input terminal for receiving an input signal to be delayed, 10 denotes a delay unit for providing the input signal applied to the input terminal 11 with a plurality of certain time delays so as to generate a plurality of delayed outputs, 12 denotes a multiplexer for selecting one delayed output from among the plurality of delayed outputs from the delay unit 10 and for furnishing the selected output to an output terminal 13, and 19 denotes a register into which information for controlling the multiplexer 12 is written. As shown in FIG. 1, the VCO 1 includes five inverters 8. However, the number of inverters 8 included in the VCO 1 is not limited to five. The frequency divider 3 divides the frequency of an output signal of the VCO 1 by n to generate and furnish a frequency-divided clock of the same frequency as the reference clock to the charge pump 6. The VCO 1 generates a frequency-multiplied clock whose phase is controlled by the control signal from the charge pump 6. The frequency-multiplied clock has a frequency that is n-times as large as that of the reference clock. As shown in FIG. 1, the delay unit 10 is comprised of a plurality of inverters 20 connected in series, the number of inverters 20 being even. The plurality of inverters 20 in series are divided into a plurality of groups each including two inverters, and a plurality of lead lines disposed at intervals of one group of two inverters and two leads connected to both ends of the series of plural inverters 20 are connected to the multiplexer 12. It is desirable that the plurality of inverters 20 are manufactured in the same semiconductor process that the plurality of inverters 8 for use in the VCO 1 are manufactured.

Figure 2:
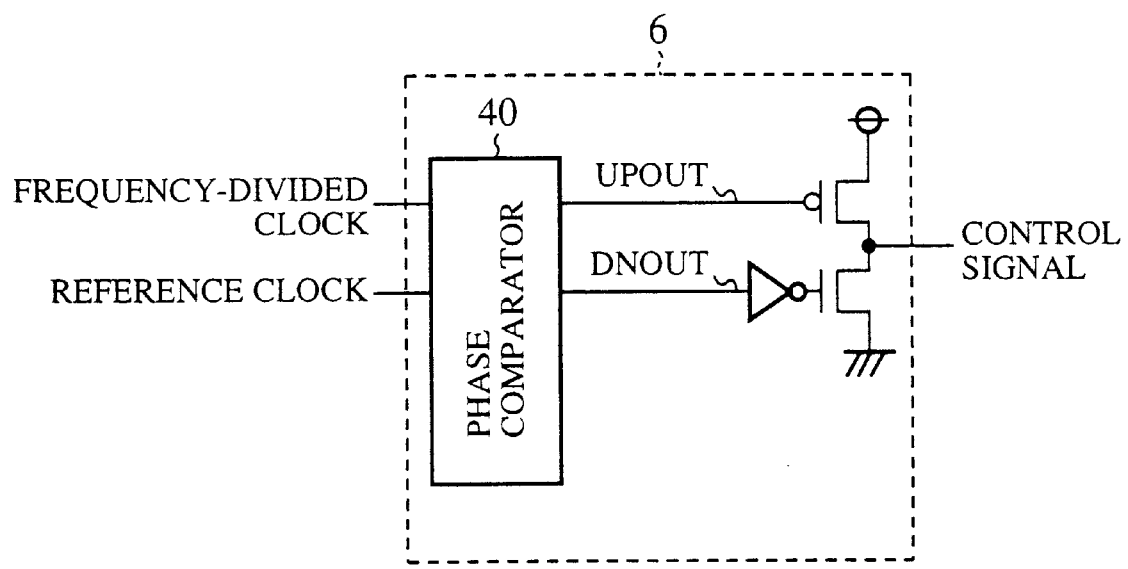
FIG. 2 is a block diagram showing the structure of the charge pump included in a PLL of the delay circuitry, as shown in FIG. 1, according to the first embodiment of the present invention.
Figure 3:
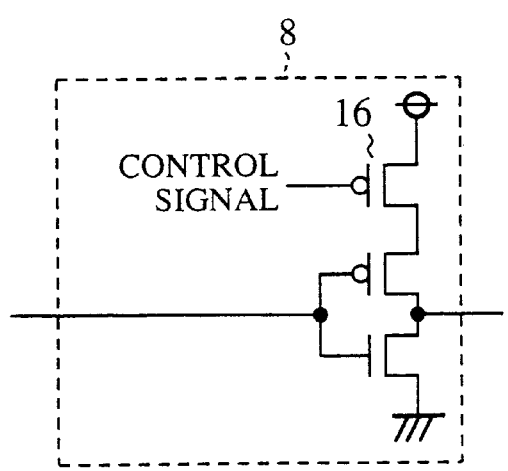
FIG. 3 is a block diagram showing the structure of an example of each of a plurality of inverters included in the PLL of the delay circuitry, as shown in FIG. 1, according to the first embodiment of the present invention.

Referring next to FIG. 2, there is illustrated a block diagram showing the structure of the charge pump 6. In the figure, reference numeral 40 denotes a phase comparator for comparing the phase of the reference clock with that of the frequency-divided clock from the frequency divider 3 to generate signals UPOUT and DOWNOUT each having a value corresponding to the phase difference between the phases of the reference clock and frequency-divided clock. FIG. 3 is a block diagram showing the structure of each of the plurality of inverters 8. In the figure, reference numeral 16 denotes a p-channel MOS transistor having a resistance that varies according to the value of the control signal applied thereto.

Next, a description will be made as to the operation of the delay circuitry of the first embodiment, assuming that the VCO 1 of the PLL 9 is comprised of five inverters 8 and the oscillator 4 generates a reference clock having a pulse repetition period of 25 nsec, i.e., having a frequency of 40 MHz. When the PLL 9 receives the reference clock, the charge pump 6 of the PLL 9 compares the phase of the reference clock with that of the frequency-divided clock from the frequency divider 3. The charge pump 6 changes the voltage of the control signal to be furnished to the VCO 1 according to the comparison result. The charge pump 6 increases the voltage of the control signal when the phase of the frequency-divided clock leads that of the reference clock, and decreases the voltage of the control signal otherwise. In each of the plurality of inverters 8 of the VCO 1, the p-channel MOS transistor 16 serves as a variable resister controlled by the control signal. As the control signal decreases in voltage, the p-channel MOS transistor 16 decreases in resistance. In other words, as the control signal increases in voltage, the p-channel MOS transistor 16 increases in resistance. The time delay provided by each of the plurality of inverters 8 thus decreases with decrease in the voltage of the control signal, and hence increases with increase in the voltage of the control signal. As a result, when the phase of the frequency-divided clock leads that of the reference clock, the pulse repetition period of the frequency-multiplied clock increases since the time delay provided by each of the plurality of inverters 8 increases. In contrast, when the phase of the reference clock leads that of the frequency-divided clock, the pulse repetition period of the frequency-multiplied clock decreases since the time delay provided by each of the plurality of inverters 8 decreases. When the reference clock is made to be in phase with the frequency-divided clock, the PLL 9 brings itself into its locked state. When the PLL 9 is held in its locked state, the frequency-divided clock that is obtained by frequency-dividing the frequency-multiplied clock by n by means of the frequency divider 3 has the same pulse repetition period as the reference clock. At that time, the frequency-multiplied clock generated by the VCO 1 has a pulse repetition period of (25/n) nsec. For example, when the frequency divider 3 divides the frequency of the frequency-multiplied clock applied thereto by 20, the frequency-multiplied clock generated by the VCO 1 has a pulse repetition period of 1.25 nsec.

The control signal furnished by the charge pump 6 of the PLL 9 is applied to a control terminal of each of the plurality of inverters 20 of the delay unit 10 as well as to a control terminal of each of the plurality of inverters 8 of the VCO 1, as shown in FIG. 1. The time delay provided by each of the plurality of inverters 20 is thus controlled by the PLL 9. When the PLL 9 brings itself into its locked state, the frequency-divided clock, which has been obtained by frequency-dividing the frequency-multiplied clock generated by the VCO 1, is made to be in phase with the reference clock. The pulse repetition period of the frequency-multiplied clock becomes (25/n) nsec when the pulse repetition period of the reference clock generated by the oscillator 4 is 25 nsec for example. As a result, the time delay provided by each of the plurality of inverters 8 of the VCO 1 is fixedly set to a predetermined value. Also, the time delay provided by each of the plurality of inverters 20 of the delay unit 10 is fixedly set to the predetermined value under control of the PLL 9. For example, when the frequency divider 3 divides the frequency of the frequency-multiplied clock from the VCO 1 by 20, the pulse repetition period of the frequency-multiplied clock generated by the VCO 1 becomes 1.25 nsec. When the VCO 1 is comprised of five inverters 8, the time delay provided by each of the plurality of inverters 8 becomes 0.25 nsec. Similarly, the time delay provided by each of the plurality of inverters 20 of the delay unit 10 becomes 0.25 nsec. Accordingly, when the delay unit 10 is comprised of 2N inverters 20, the delay unit 10 provides an input signal applied thereto by way of the input terminal 11 with a plurality of time delays in the range of 0 to (0.5×N) nsec, the time delays being set in increments of 0.5 nsec, so as to generate and furnish (N+1) outputs to the multiplexer 12. In other words, the smallest change in the time delay to be provided to the input signal applied to the input terminal 11 by the delay unit 10 corresponds to the time delay provided by each group of two inverters 20. The multiplexer 12 is controlled according to information written into the register 19. The multiplexer 12 selects one output from among the plurality of outputs from the delay unit 10 according to the contents of the register 19.

Figure 4:
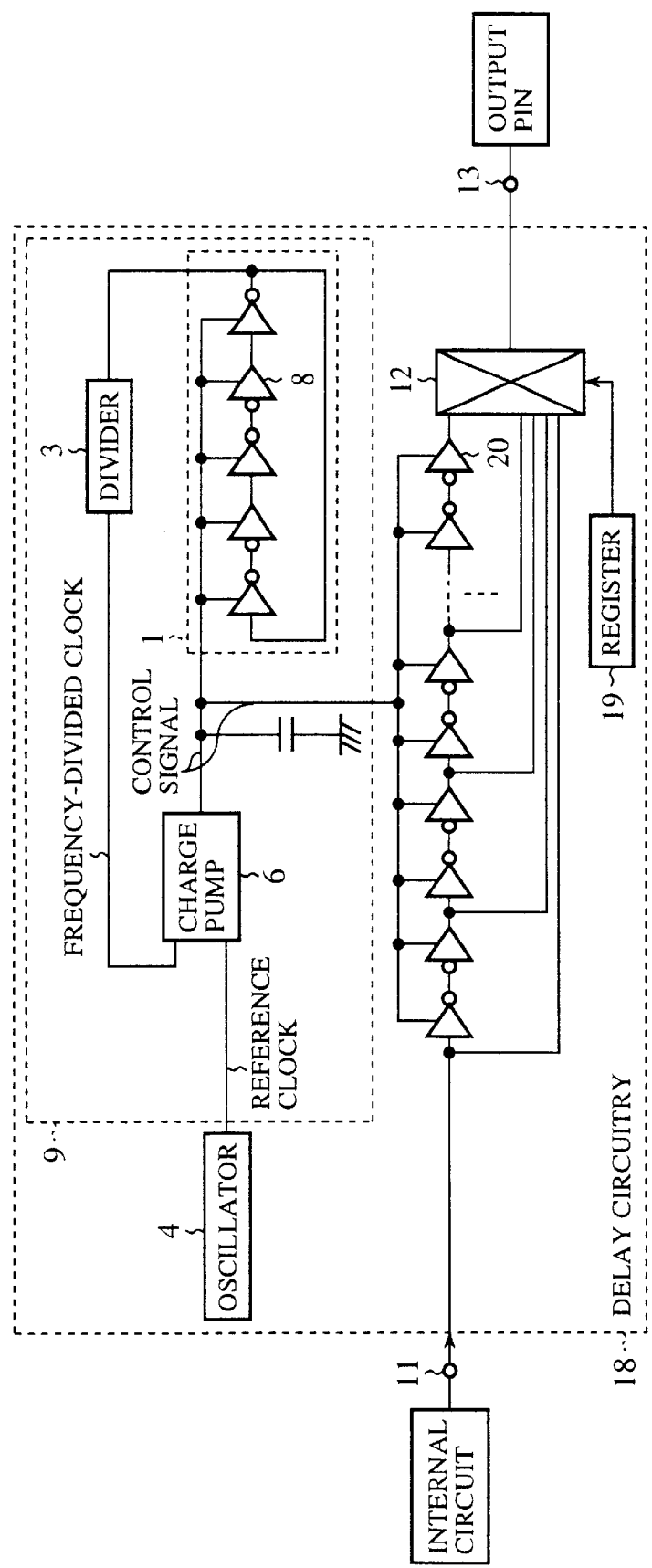
FIG. 4 is a block diagram showing the structure of an example of circuitry in which the delay circuitry according to the first embodiment is used for controlling the AC characteristic of the circuitry.

Referring next to FIG. 4, there is illustrated a block diagram showing an example in which the delay circuitry according to the first embodiment is disposed at an output terminal of an arbitrary internal circuit. The provision of the delay circuitry between an output pin and the output terminal of the internal circuit makes it possible to provide an output signal from the internal circuit with a certain time delay in the range of 0 to a certain value, the time delay being set in increments of a predetermined time step. In other words, the delay circuitry can control the AC characteristic of the output terminal of the internal circuit by changing the contents of the register 19. As an alternative, the delay circuitry according to the first embodiment can be disposed at an input terminal of an arbitrary internal circuit. In this case, the delay circuitry can similarly control the AC characteristic of the input terminal of the internal circuit by changing the contents of the register 19.

As previously mentioned, in accordance with the first embodiment, the delay circuitry can generate a plurality of outputs that are delayed by respective predetermined time delays in the range of 0 to a certain value, the time delays being set in increments of a predetermined time step, by means of the delay unit 10 that is controlled by the PLL 9, and select a desired output from among the plurality of outputs from the delay unit 10 by means of the multiplexer 12. Accordingly, the delay circuitry 18 of FIG. 1 can precisely control the time delay in steps of a predetermined time step, e.g., 0.5 nsec. Even though the time delay provided by the delay unit 10 varies due to a change in the ambient temperature or a change in the voltage of a power supply, the same change occurs in the PLL 9 to make the PLL 9 operate to reduce the phase difference caused by the change between the phases of the frequency-multiplied clock generated by the PLL 9 and reference clock to zero, and therefore the time delay provided to the input signal by the delay unit 10 immediately, easily return to the desired set value. Furthermore, since the plurality of inverters 20 of the delay unit 10 are manufactured in the same semiconductor process that the plurality of inverters 8 included in the PLL 9 are manufactured, variations in the manufacturing process do not cause a change in the time delay from the desired set value.

Second Embodiment

Figure 5:
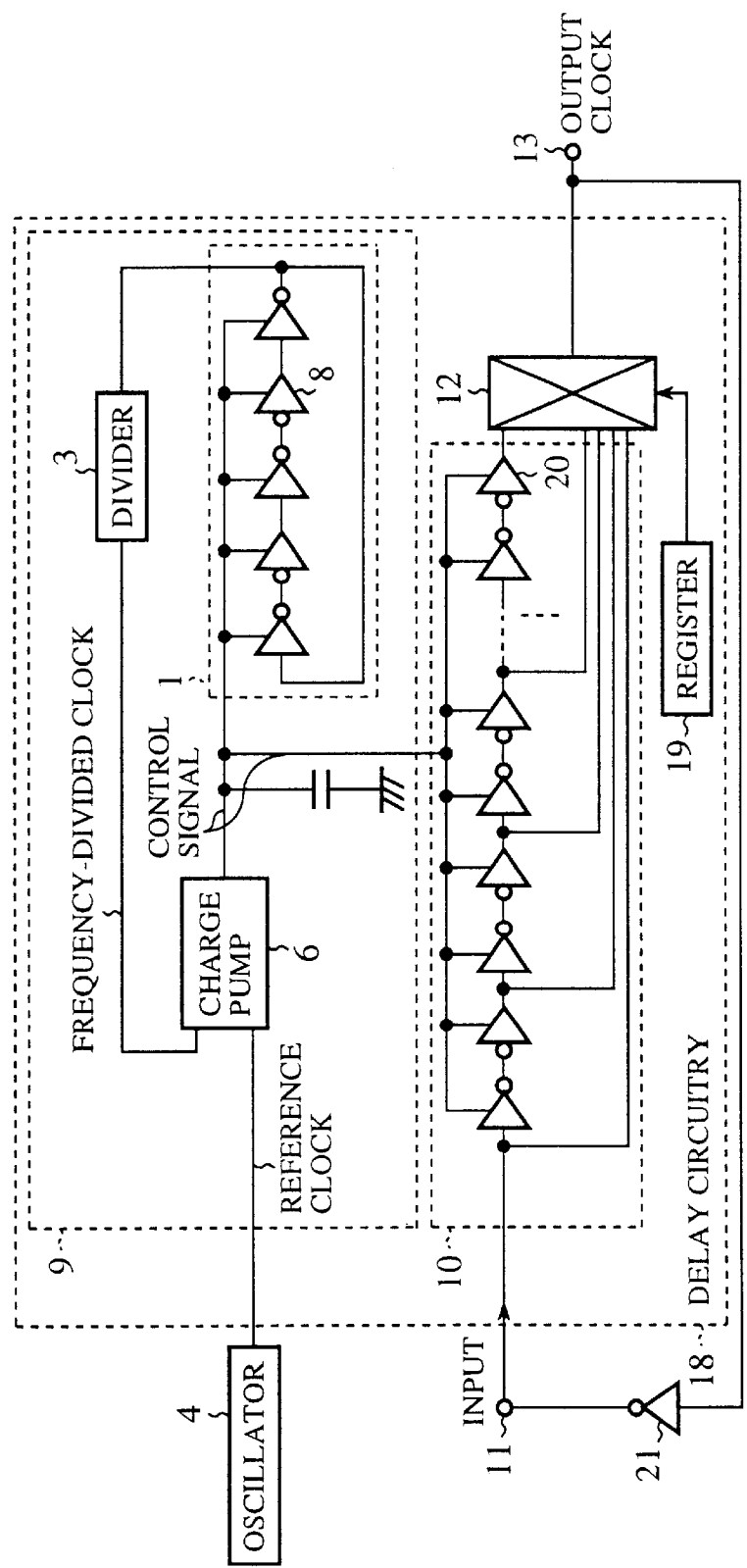
FIG. 5 is a block diagram showing the structure of clock generating circuitry according to a second embodiment of the present invention.

Referring next to FIG. 5, there is illustrated a block diagram showing the structure of clock generating circuitry according to a second embodiment of the present invention. In the figure, the same reference numerals as shown in FIG. 1 designate the same components as those of the delay circuitry according to the aforementioned first embodiment, and therefore the description of the components will be omitted hereinafter. As can be seen from FIG. 5, the clock generating circuitry of the second embodiment includes delay circuitry 18 according to the aforementioned first embodiment. In FIG. 5, reference numeral 21 denotes an inverter that connects an output terminal 13 of the delay circuitry 18 with an input terminal 11 of the delay circuitry to constitute a loop. As shown in FIG. 5, a VCO 1 of a PLL 9 includes five inverters 8. However, the number of inverters 8 included in the VCO 1 is not limited to five.

Next, a description will be made as to the operation of the delay circuitry of the first embodiment, assuming that the VCO 1 of the PLL 9 is comprised of five inverters 8, as shown in FIG. 5, and an oscillator 4 generates a reference clock having a pulse repetition period of 25 nsec, i.e., having a frequency of 40 MHz. The delay circuitry 18 operates in the same manner as that of the first embodiment. That is, when the PLL 9 receives a reference clock, a charge pump 6 of the PLL 9 compares the phase of the reference clock with that of a frequency-divided clock from a frequency divider 3. The charge pump 6 changes the voltage of a control signal to be furnished to the VCO 1 according to the comparison result so that the frequency-divided clock is made to be in phase with the reference clock. When the reference clock is made to be in phase with the frequency-divided clock, the PLL 9 brings itself into its locked state. When the PLL 9 is held in its locked state, the frequency-divided clock that is obtained by frequency-dividing the frequency-multiplied clock by n by means of the frequency divider 3 has the same pulse repetition period as the reference clock. At that time, the frequency-multiplied clock generated by the VCO 1 has a pulse repetition period of (25/n) nsec. For example, when the frequency divider 3 divides the frequency of the frequency-multiplied clock applied thereto by 20, the frequency-multiplied clock generated by the VCO 1 has a pulse repetition period of 1.25 nsec.

The control signal furnished by the charge pump 6 of the PLL 9 is applied to the control terminal of each of the plurality of inverters 20 of the delay unit 10 as well as to the control terminal of each of the plurality of inverters 8 of the VCO 1, as shown in FIG. 5. The time delay provided by each of the plurality of inverters 20 is thus controlled by the PLL 9. When the PLL 9 brings itself into its locked state, the frequency-divided clock, which has been obtained by frequency-dividing the frequency-multiplied clock generated by the VCO 1, is made to be in phase with the reference clock. The pulse repetition period of the frequency-multiplied clock becomes (25/n) nsec when the pulse repetition period of the reference clock generated by the oscillator 4 is 25 nsec for example. As a result, the time delay provided by each of the plurality of inverters 8 of the VCO 1 is fixedly set to a predetermined value. Also, the time delay provided by each of the plurality of inverters 20 of the delay unit 10 is fixedly set to the predetermined value under control of the PLL 9. For example, when the frequency divider 3 divides the frequency of the frequency-multiplied clock from the VCO 1 by 20, the time delay provided by each of the plurality of inverters 20 in the delay unit 10 becomes 0.25 nsec. Accordingly, when the delay unit 10 is comprised of 2N inverters 20, the delay unit 10 provides an input signal applied thereto by way of the input terminal 11 with a plurality of time delays in the range of 0 to (0.5×N) nsec, the time delays being set in increments of 0.5 nsec, so as to generate and furnish (N+1) outputs to a multiplexer 12. In other words, the smallest change in the time delay to be provided to an input signal from the inverter 21 applied to the input terminal 11 by the delay unit 10 corresponds to the time delay provided by each group of two inverters 20. The multiplexer 12 is controlled according to information written into a register 19. The multiplexer 12 selects one output from among the plurality of outputs from the delay unit 10 according to the contents of the register 19. Accordingly, the clock generating circuitry of the second embodiment can precisely change the pulse repetition period of an output clock in steps of 0.5 nsec according to the contents of the register 19. The output clock has a basic pulse repetition period determined by the time delay caused by the inverter 21. In the above example, the pulse repetition period of the output clock can thus range from the basic pulse repetition period to {the basic pulse repetition period+(0.5×N} nsec, and vary in steps of 0.5 nsec.

As previously mentioned, in accordance with the second embodiment, the clock generating circuitry can generate a plurality of outputs that are delayed by respective predetermined time delays in the range of 0 to a certain value, the time delays being set in increments of a predetermined time step, by means of the delay unit 10 controlled by the PLL 9, and precisely change the pulse repetition period of the output clock in steps of the predetermined time step using the delay circuitry 18 that can select a desired output from among the plurality of outputs from the delay unit 10 by means of the multiplexer 12. Even though the time delay provided by the delay unit 10 in the delay circuitry 18 varies due to a change in the ambient temperature or a change in the voltage of a power supply, the same change occurs in the PLL 9 to make the PLL 9 operate to reduce the phase difference caused by the change between the phases of the frequency-multiplied clock generated by the PLL 9 and reference clock to zero, and therefore the pulse repetition period of the output clock defined by the delay circuitry 18 immediately, easily return to the desired set value. Furthermore, since the plurality of inverters 20 of the delay unit 10 are manufactured in the same semiconductor process that the plurality of inverters 8 included in the PLL 9 are manufactured, variations in the manufacturing process do not cause a change in the pulse repetition period of the output clock from the desired set value.

Third Embodiment

Figure 6:
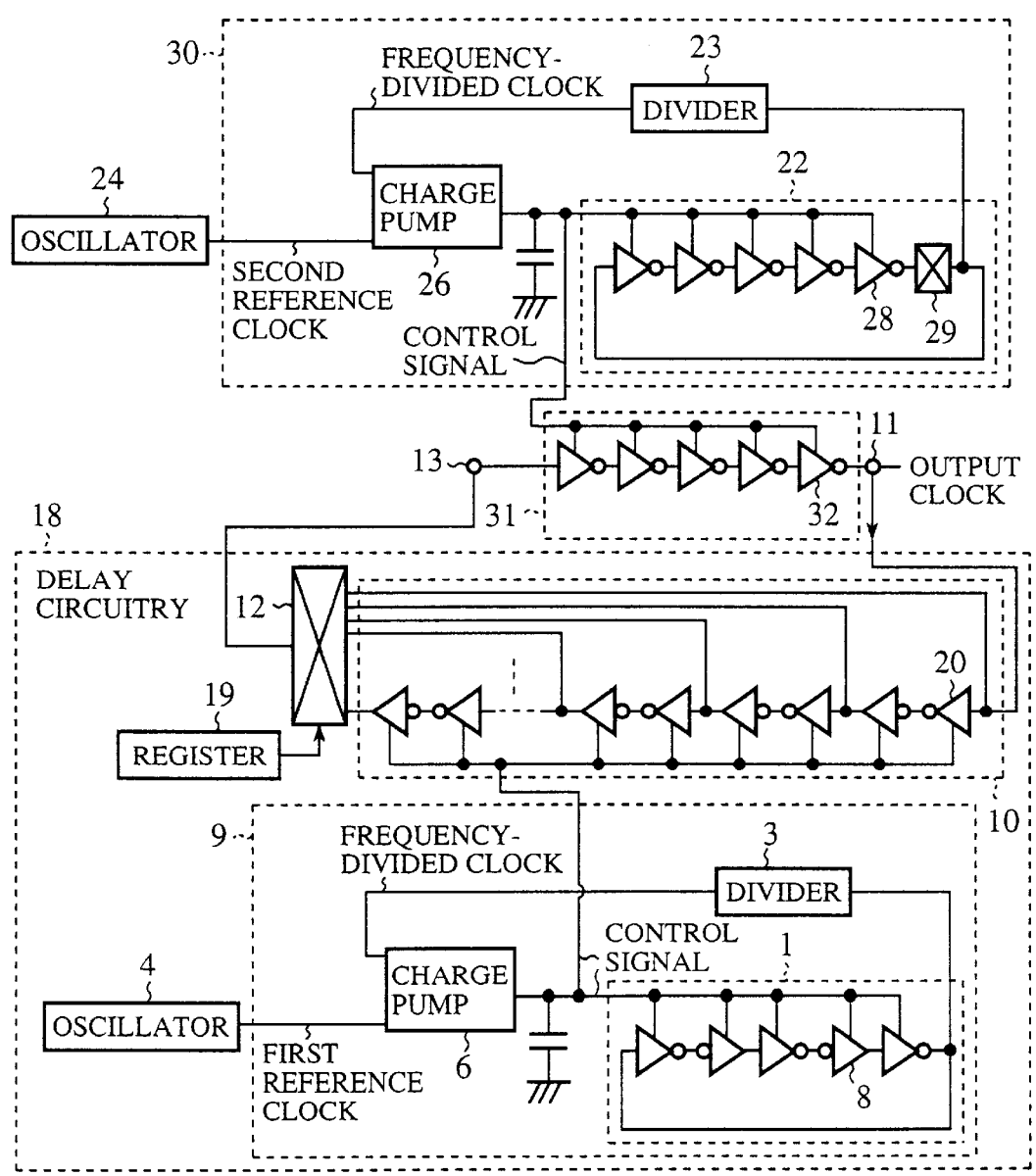
FIG. 6 is a block diagram showing the structure of clock generating circuitry according to a third embodiment of the present invention.

Referring next to FIG. 6, there is illustrated a block diagram showing the structure of clock generating circuitry according to a third embodiment of the present invention. In the figure, the same reference numerals as shown in FIG. 1 designate the same components as those of the delay circuitry according to the aforementioned first embodiment, and therefore the description of the components will be omitted hereinafter. As can be seen from FIG. 6, the clock generating circuitry of the third embodiment includes delay circuitry 18 according to the aforementioned first embodiment. In FIG. 6, reference numeral 24 denotes an oscillator for generating a second reference clock, 26 denotes a charge pump for comparing the phase of the second reference clock with that of an output of a frequency divider 23 so as to furnish a control signal having a value corresponding to the difference between the phases of the second reference clock and output of the frequency divider 23 to a VCO 22, 28 denotes an inverter disposed in the VCO 22, 29 denotes a multiplexer that provides an input signal with the same time delay as provided by a multiplexer 12 disposed in the delay circuitry 18, 30 denotes a PLL comprised of the VCO 22, frequency divider 23, and charge pump 26, 31 denotes a delay unit connected between output and input terminals 13 and 11 of the delay circuitry 18, for providing an input signal with a time delay that is controlled by the control signal from the charge pump 26 of the PLL 30, and 32 denotes an inverter disposed in the delay unit 31, for providing an input signal with a time delay that is controlled by the control signal. The frequency divider 23 divides the frequency of the output signal of the VCO 22 by m so as to generate and furnish a frequency-divided clock of the same frequency as the second reference clock to the charge pump 26. The VCO 22 generates a frequency-multiplied clock whose phase is controlled by the control signal from the charge pump 26, and whose frequency is m-times as large as the second reference clock.

As shown in FIG. 6, the delay unit 31 is comprised of a plurality of inverters 32 in series, the number of which is the same as that of the plurality of inverters 28 built in the VCO 22. In the example shown of FIG. 6, the VCO 22 includes five inverters 28 and the delay unit 31 includes five inverters 32. However, the number of inverters 28 included in the VCO 22 is not limited to five. It is desirable that the plurality of inverters 32 are manufactured in the same semiconductor process that the plurality of inverters 28 for use in the VCO 22 are manufactured.

Next, a description will be made as to the operation of the clock generating circuitry of the third embodiment, assuming that the VCO 1 of the PLL 9 in the delay circuitry 18 is comprised of five inverters 8, the VCO 22 of the PLL 30 is comprised of five inverters 28, the delay unit 31 is comprised of five inverters 32, an oscillator 4 in the delay circuitry 18 generates a first reference clock having a pulse repetition period of 25 nsec, i.e., having a frequency of 40 MHz, and the oscillator 24 generates a second reference clock having a pulse repetition period of 20 nsec, i.e., having a frequency of 50 MHz. Since the delay circuitry 18 operates in the same manner as that of the first embodiment, the description of the operation of the delay circuitry 18 will be omitted hereinafter.

Like the PLL 9 of the delay circuitry 18, when the PLL 30 receives the second reference clock, the charge pump 26 of the PLL 30 compares the phase of the second reference clock with that of the frequency-divided clock from the frequency divider 23. The charge pump 26 changes the voltage of a control signal to be furnished to the VCO 22 according to the comparison result so that the frequency-divided clock is made to be in phase with the second reference clock. When the second reference clock is made to be in phase with the frequency-divided clock, the PLL 30 brings itself into its locked state. When the PLL 30 is held in its locked state, the frequency-divided clock that is obtained by frequency-dividing the frequency-multiplied clock by m by means of the frequency divider 23 has the same pulse repetition period as the second reference clock. At that time, the frequency-multiplied clock generated by the VCO 22 has a pulse repetition period of (20/m) nsec. For example, when the frequency divider 23 divides the frequency of the frequency-multiplied clock applied thereto by 2, the frequency-multiplied clock generated by the VCO 22 has a pulse repetition period of 10 nsec.

The control signal furnished by the charge pump 26 of the PLL 30 is applied to a control terminal of each of the plurality of inverters 32 of the delay unit 31 as well as to a control terminal of each of the plurality of inverters 28 of the VCO 22, as shown in FIG. 6. The time delay provided by each of the plurality of inverters 32 is thus controlled by the PLL 30. When the PLL 30 brings itself into its locked state, the frequency-divided clock, which has been obtained by frequency-dividing the frequency-multiplied clock generated by the VCO 22, is made to be in phase with the second reference clock. The pulse repetition period of the frequency-multiplied clock becomes (20/m) nsec when the pulse repetition period of the second reference clock generated by the oscillator 24 is 20 nsec for example. As a result, the time delay provided by each of the plurality of inverters 28 of the VCO 22 is fixedly set to a predetermined value. Also, the time delay provided by each of the plurality of inverters 32 of the delay unit 31 is fixedly set to the predetermined value under control of the PLL 30. For example, when the frequency divider 23 divides the frequency of the frequency-multiplied clock from the VCO 22 by 2, the frequency-multiplied clock generated by the VCO 22 has a pulse repetition period of 10 nsec. Accordingly, the time delay to be provided to an input signal by the delay unit 31 and the multiplexer 12 of the delay circuitry 18 is 10 nsec since the time delay provided by the plurality of inverters 28 and the multiplexer 29 built in the VCO 22 is the same as the sum of the time delay provided by the delay unit 31 and the time delay provided by the multiplexer 12. As a result, the clock generating circuitry generates an output clock having a basic pulse repetition period of 10 nsec, i.e., a basic frequency of 100 MHz.

On the other hand, when the frequency divider 3 in the delay circuitry 18 divides the frequency of the frequency-multiplied clock from the VCO 1 by 20, the time delay provided by each of the plurality of inverters 20 of the delay unit 10 becomes 0.25 nsec, as previously explained in First Embodiment. Accordingly, when the delay unit 10 is comprised of 2 N inverters 20, the delay unit 10 provides an input signal applied thereto by way of the input terminal 11 with a plurality of time delays in the range of 0 to (0.5×N) nsec, the time delays being set in increments of 0.5 nsec, so as to generate and furnish (N+1) outputs to the multiplexer 12. The multiplexer 12 selects one output from among the plurality of outputs from the delay unit 10 according to the contents of a register 19. Accordingly, the clock generating circuitry of the third embodiment can precisely change the pulse repetition period of the output clock from 10 nsec to (10+0.5×N) nsec in steps of 0.5 nsec according to the contents of the register 19.

Preferably, the first and second reference clocks are equal in frequency. For example, when the first and second oscillators 4 and 24 generate first and second reference clocks having an equal repetition period of 25 nsec (i.e., of equal frequency of 40 MHz), the frequency divider 3 divides the frequency of the frequency-multiplied clock from the VCO 1 by 20, and the frequency divider 23 maintains the frequency of the frequency-multiplied clock from the VCO 22 just as it is, the clock generating circuitry can precisely change the pulse repetition period of the output clock according to the contents of the register 19 so that it ranges from 25 nsec to (25+(0.5×N)} nsec in steps of 0.5 nsec.

As previously mentioned, in accordance with the third embodiment, the clock generating circuitry can precisely maintain the basic pulse repetition period of the output clock by means of the delay unit 31 that is controlled by the PLL 30, and precisely change the pulse repetition period of the output clock in steps of the predetermined time step using the delay circuitry 18 that can select a desired output from among the plurality of outputs from the delay unit 10 by means of the multiplexer 12. Even though the time delay provided by the delay unit 31 varies due to a change in the ambient temperature or a change in the voltage of a power supply, the same change occurs in the PLL 30 to make the PLL 30 operate to reduce the phase difference caused by the change between the phases of the frequency-multiplied clock generated by the PLL 30 and second reference clock to zero, and therefore the basic pulse repetition period of the output clock defined by the delay unit 31 immediately, easily return to the desired set value. In addition, even though the time delay provided by the delay unit 10 in the delay circuitry 18 varies due to a change in the ambient temperature or a change in the voltage of a power supply, the same change occurs in the PLL 9 to make the PLL 9 operate to reduce the phase difference caused by the change between the phases of the frequency-multiplied clock generated by the PLL 9 and first reference clock to zero, and therefore the pulse repetition period of the output clock defined by the delay circuitry 18 immediately, easily return to the desired set value. Furthermore, since the plurality of inverters 32 of the delay unit 31 are manufactured in the same semiconductor process that the plurality of inverters 28 included in the PLL 30 are manufactured, variations in the manufacturing process do not cause a change in the basic pulse repetition period of the output clock from the desired set value.

Fourth Embodiment

Figure 7:
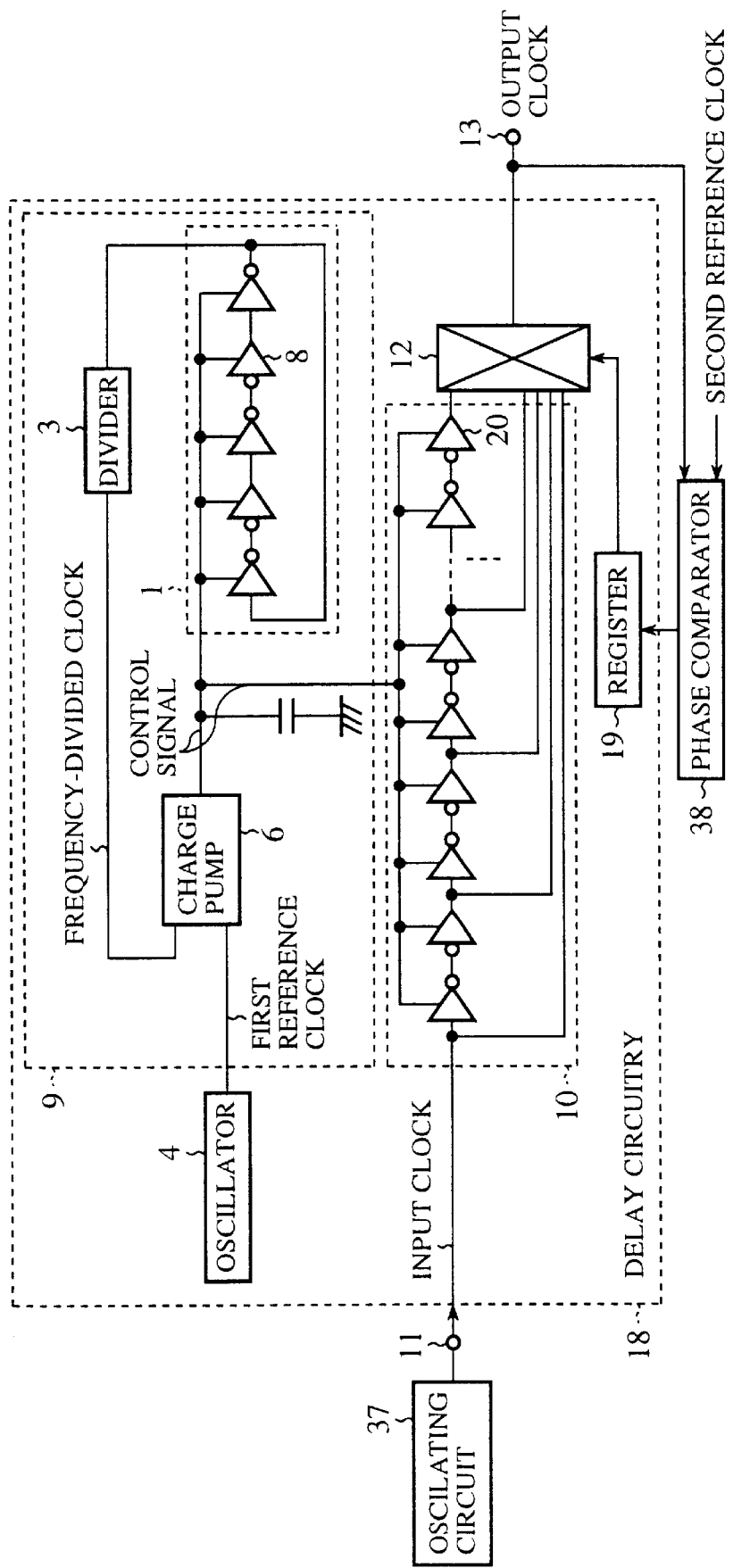
FIG. 7 is a block diagram showing the structure of phase synchronization circuitry according to a fourth embodiment of the present invention.

Referring next to FIG. 7, there is illustrated a block diagram showing the structure of phase synchronization circuitry according to a fourth embodiment of the present invention. In the figure, the same reference numerals as shown in FIG. 1 designate the same components as those of the delay circuitry according to the aforementioned first embodiment, and therefore the description of the components will be omitted hereinafter. As can be seen from FIG. 7, the phase synchronization circuitry of the fourth embodiment includes delay circuitry 18 according to the aforementioned first embodiment. In FIG. 7, reference numeral 37 denotes an oscillator for generating a clock having a predetermined pulse repetition period. The oscillator 37 can consist of a PLL. As an alternative, the oscillator 37 can be clock generating circuitry according to the aforementioned second or third embodiment. Further, in FIG. 7, reference numeral 38 denotes a phase comparator for comparing the phase of a second reference clock applied thereto with that of an output clock of the delay circuitry 18 and for furnishing a control signal having a value corresponding to the phase difference between the phases of the second reference clock and output clock to a register 19 to change the contents of the register 19 so that the phase difference becomes zero.

Next, a description will be made as to the operation of the phase synchronization circuitry of the fourth embodiment, assuming that a VCO 1 of the PLL 9 in the delay circuitry 18 is comprised of five inverters 8 and an oscillator 4 generates a first reference clock having a pulse repetition period of 25 nsec, i.e., having a frequency of 40 MHz. Since the delay circuitry 18 operates in the same manner as that of the first embodiment, the description of the operation of the delay circuitry will be omitted hereinafter.

When the frequency divider 3 of the delay circuitry 18 divides the frequency of the frequency-multiplied clock applied thereto from the VCO 1 by 20, the time delay provided by each of the plurality of inverters 20 in the delay unit 10 becomes 0.25 nsec, as previously mentioned in First Embodiment. Accordingly, when the delay unit 10 is comprised of 2 N inverters 20, the delay unit 10 provides an input signal applied thereto with a plurality of time delays in the range of 0 to (0.5×N) nsec, the time delays being set in increments of 0.5 nsec, so as to generate and furnish (N+1) outputs to a multiplexer 12. The multiplexer 12 selects one output from among the plurality of outputs from the delay unit 10 according to the contents of the register 19. Accordingly, the phase synchronization circuitry of the fourth embodiment can precisely delay the phase of the input clock by a time delay in the range of 0 to (0.5×N) nsec, the time delay being set in increments of 0.5 nsec, according to the contents of the register 19.

When making the output clock of the oscillator 37 be in phase with the other clock, i.e., the second reference clock, the phase comparator 38 compares the phase of the second reference clock applied thereto with that of the output clock of the delay circuitry 18 and then furnishes a control signal having a value corresponding to the phase difference between the phases of the second reference clock and output clock to the register 19 to change the contents of the register 19 so that the phase difference becomes zero. In other words, when the phase of the output clock leads that of the second reference clock, the phase comparator 38 changes the contents of the register 19 so that the number of inverters 20 through which the output clock will be passed in the delay unit 10 is increased. Otherwise, the phase comparator 38 changes the contents of the register 19 so that the number of inverters 20 through which the out put clock will be passed in the delay unit 10 is decreased. When the frequency divider 3 of the delay circuitry 18 divides the frequency of the frequency-multiplied clock from the VCO 1 by 20, the phase comparator can change the contents of the register 19 to precisely change the phase of the output clock by a time delay in the range of 0 to (0.5×N) nsec in steps of 0.5 nsec, thus being able to make the output clock be in phase with the second reference clock.

As previously mentioned, in accordance with the fourth embodiment, the phase synchronization circuitry can precisely change the phase of an output clock in steps of the predetermined time step using the delay circuitry 18 that can select a desired output from among the plurality of outputs from the delay unit 10 by means of the multiplexer 12, thus being able to make the output clock be in phase with another clock as needed. Even though the time delay provided by the delay unit 10 in the delay circuitry 18 varies due to a change in the ambient temperature or a change in the voltage of a power supply, the same change occurs in the PLL 9 to make the PLL 9 operate to reduce the phase difference caused by the change between the phases of the frequency-multiplied clock generated by the PLL 9 and reference clock to zero, and therefore the phase shift provided to the input clock, which has been defined by the delay circuitry 18, immediately, easily return to the desired set value. Furthermore, since the plurality of inverters 20 of the delay unit 10 are manufactured in the same semiconductor process that the plurality of inverters 8 included in the PLL 9 are manufactured, variations in the manufacturing process do not cause a change in the phase shift provided for the input clock from the desired set value.

Fifth Embodiment

Figure 8:
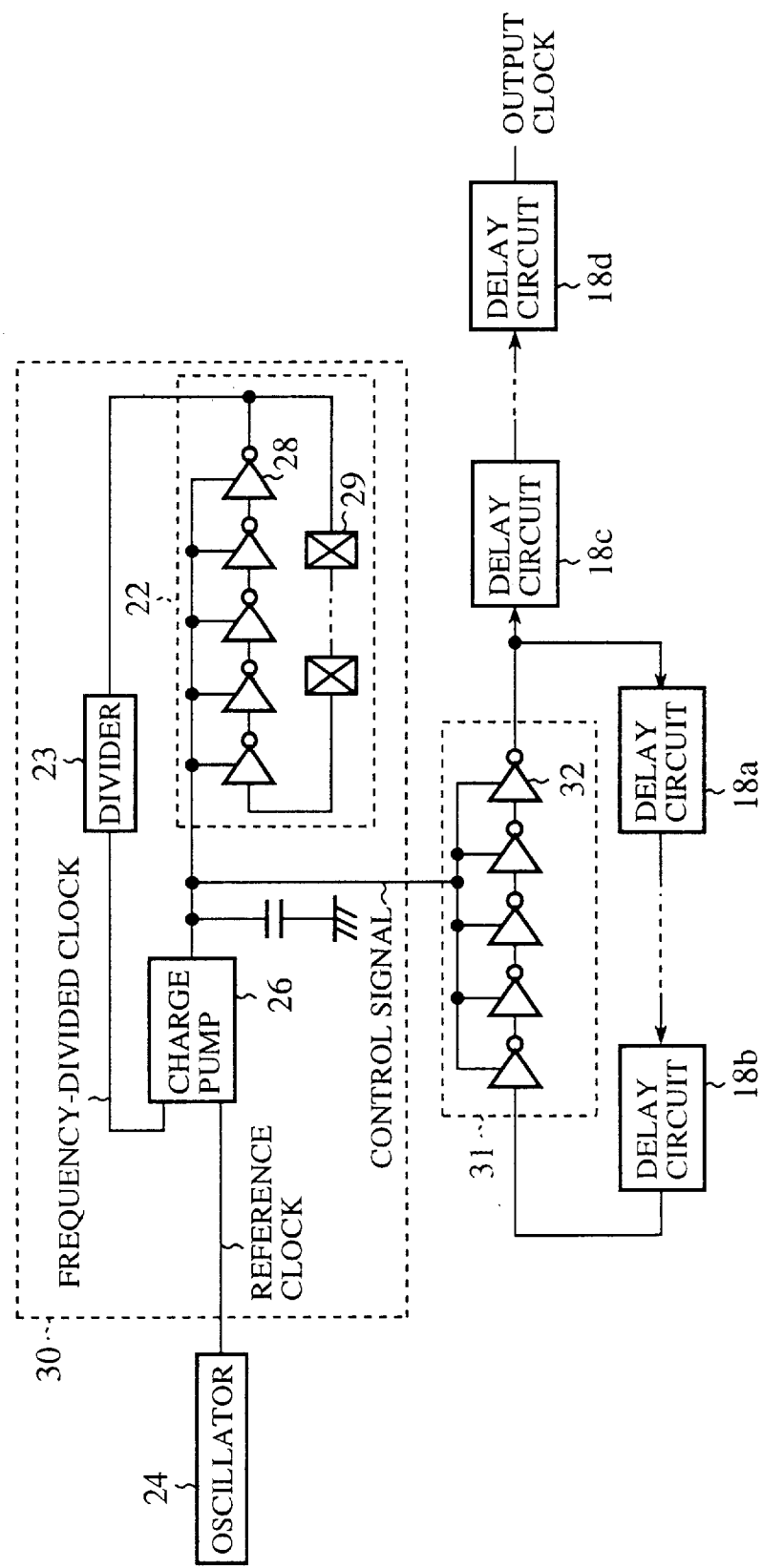
FIG. 8 is a block diagram showing the structure of clock generating circuitry according to a fifth embodiment of the present invention.

Referring next to FIG. 8, there is illustrated a block diagram showing the structure of clock generating circuitry according to a fifth embodiment of the present invention. In the figure, the same reference numerals as shown in FIG. 6 designate the same components as those of the clock generating circuitry according to the aforementioned third embodiment, and therefore the description of the components will be omitted hereinafter. As can be seen from FIG. 8, the clock generating circuitry of the fifth embodiment includes a plurality of delay circuits 18*a*, 18*b*, 18*c*, and 18*d* having the same structure as the delay circuitry according to the aforementioned first embodiment. In FIG. 8, reference numeral 24 denotes an oscillator for generating a reference clock, 26 denotes a charge pump for comparing the phase of the reference clock with that of an output of a frequency divider 23 so as to generate and furnish a control signal having a value corresponding to the difference between the phases of the reference clock and output of the frequency divider 23 to a VCO 22, 28 denotes an inverter disposed in the VCO 22, 29 denotes a multiplexer built in the VCO, for providing an input signal with the same time delay as provided by a multiplexer disposed in each of the delay circuits 18*a* and 18*b*, 30 denotes a PLL comprised of the VCO 22, frequency divider 23, and charge pump 26, 31 denotes a delay unit for providing an input signal with a time delay that is controlled by the control signal from the charge pump 26 of the PLL 30, and 32 denotes an inverter disposed in the delay unit 31, for providing an input with a time delay that is controlled by the control signal.

The frequency divider 23 divides the frequency of an output signal from the VCO 22 by m so as to generate and furnish a frequency-divided clock of the same frequency as the reference clock to the charge pump 26. The VCO 22 generates a frequency-multiplied clock whose phase is controlled by the control signal from the charge pump 26, and whose frequency is m-times as large as the reference clock. As shown in FIG. 8, the delay unit 31 is comprised of a plurality of inverters 32 in series, the number of which is the same as that of the plurality of inverters 28 built in the VCO 22. The delay unit 31 constitutes a loop together with the plurality of delay circuits 18*a* and 18*b*. In addition, the output of the delay unit 31, which also serves as the output of the loop, is connected to the plurality of delay circuits 18*c* and 18*d* in series. The clock generating circuitry according to the fifth embodiment furnishes an output clock via the delay circuit 18*d* at the final stage of the series of delay circuits 18*c* and 18*d*. In the example shown of FIG. 8, the VCO 22 is comprised of five inverters 28 and the delay unit 31 is comprised of five inverters 32. However, the number of inverters 28 included in the VCO 22 is not limited to five. It is desirable that the plurality of inverters 32 are manufactured in the same semiconductor process that the plurality of inverters 28 for use in the VCO 22 are manufactured.

Next, a description will be made as to the operation of the clock generating circuitry of the fifth embodiment, assuming that the oscillator 24 generates a reference clock having a pulse repetition period of 20 nsec, i.e., having a frequency of 50 MHz. Since each of the delay circuits 18*a*, 18*b*, 18*c*, and 18*d* operates in the same manner as that of the first embodiment, the description of the operation of them will be omitted hereinafter.

The clock generating circuitry according to the fifth embodiment as shown in FIG. 8 can set the basic pulse repetition period of the output clock by means of the PLL 30 and the delay unit 31, and adjust the pulse repetition period of the output clock by means of at least the two delay circuits 18*a* and 18*b*. In addition, the clock generating circuitry can adjust the phase of the output clock by means of at least the two delay circuits 18*c* and 18*d*. Since the clock generating circuitry according to the fifth embodiment thus comprises the plurality of delay circuits 18*a* to 18*d* for adjusting the pulse repetition period and phase of the output clock, it can adjust the pulse repetition period of the output clock over a wide range in steps of a fine time step, and further adjust the phase of the output clock over a wide range in steps of a fine time step.

When the delay circuitry 18*a* is set up so as to adjust the pulse repetition period of the output clock over the range of 0 to 10 nsec in increments of 0.5 nsec and the delay circuitry 18*b* is set up so as to adjust the pulse repetition period of the output clock over the range of 0 to 100 nsec in increments of 10 nsec, for example, the clock generating circuitry can adjust the pulse repetition period of the output clock over the range of 0 to 110 nsec in increments of 0.5 nsec. In addition, the clock generating circuitry can further adjust the phase of the output clock over the same wide range in increments of the same fine time step by means of the delay circuits 18c and 18d that are set up in the same way that the delay circuits 18a and 18b are set up.

As previously mentioned, in accordance with the fifth embodiment, the clock generating circuitry can precisely maintain the basic pulse repetition period of the output clock by means of the delay unit 31 controlled by the PLL 30, and precisely adjust the pulse repetition period of the output clock over a wide range and in steps of a fine time step and further adjust the phase of the output clock over a wide range and in steps of a fine time step, by virtue of the plurality of delay circuits 18a to 18d each provided for adjusting the pulse repetition period or phase of the output clock. Even though the basic pulse repetition period of the output clock defined by the delay unit 31 varies due to a change in the ambient temperature or a change in the voltage of a power supply, the same change occurs in the PLL 30 to make the PLL 30 operate to reduce the phase difference caused by the change between the phases of the frequency-multiplied clock generated by the PLL 30 and reference clock to zero, and therefore the basic pulse repetition period of the output clock defined by the delay unit 31 immediately, easily return to the desired set value. Even though the time delay provided by a delay unit in each of the plurality of delay circuits 18a, 18b, 18c, and 18d varies due to a change in the ambient temperature or a change in the voltage of a power supply, the same change occurs in a PLL included in the delay unit to make the PLL operate to reduce the phase difference caused by the change between the phases of the frequency-multiplied clock generated by the PLL and a reference clock applied to the PLL to zero, and therefore the phase shift provided to an input clock signal by each of the plurality of delay circuits immediately, easily return to a desired set value. Furthermore, since the plurality of inverters 32 of the delay unit 31 are manufactured in the same semiconductor process that the plurality of inverters 28 included in the PLL 30 are manufactured, variations in the manufacturing process do not cause a change in the phase shift provided to the input clock signal from the desired set value.

Sixth Embodiment

Figure 9:
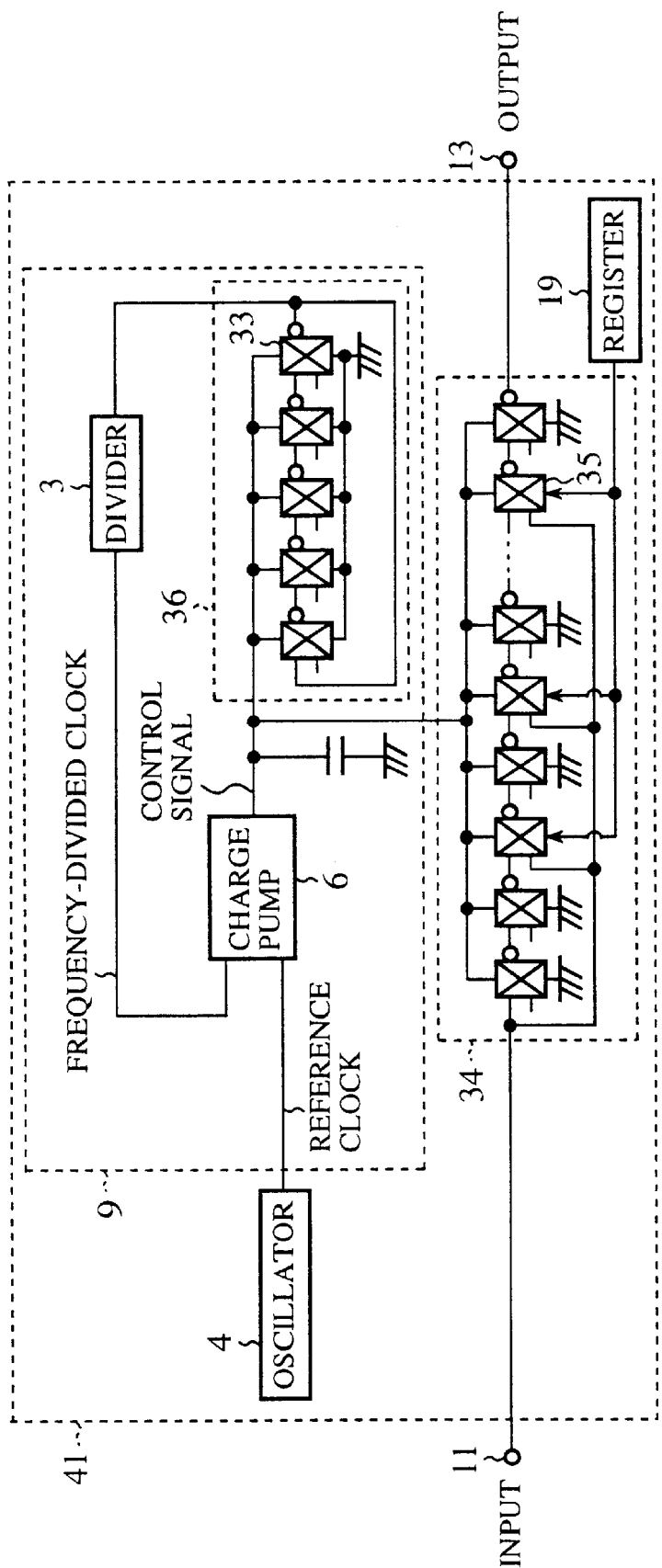
FIG. 9 is a block diagram showing the structure of delay circuitry according to a sixth embodiment of the present invention.

Referring next to FIG. 9, there is illustrated a block diagram showing the structure of delay circuitry according to a sixth embodiment of the present invention. In the figure, reference numeral 36 denotes a voltage-controlled oscillator or VCO, 4 denotes an oscillator for generating a reference clock, 6 denotes a charge pump for comparing the phase of the reference clock with that of an output of a frequency divider 3 so as to generate and furnish a control signal having a value or voltage corresponding to the difference between the phases of the reference clock and output of the frequency divider 3 to the VCO 36, 33 denotes a multiplexer disposed in the VCO 36, 9 denotes a phase-locked loop or PLL comprised of the VCO 36, charge pump 6, and frequency divider 3, 11 denotes an input terminal for receiving an input signal to be delayed, 34 denotes a delay unit disposed between the input terminal 11 and an output terminal 13, for providing the input signal applied to the input terminal 11 with a certain time delay, 35 denotes a multiplexer disposed in the delay unit 34, 19 denotes a register into which information for controlling a plurality of multiplexers 35 of the delay unit 34 is written, and 41 denotes the delay circuitry.

The frequency divider 3 divides the frequency of an output signal of the VCO 36 by n to generate and furnish a frequency-divided clock of the same frequency as the reference clock to the charge pump 6. The VCO 36 generates a frequency-multiplied clock whose phase is controlled by the control signal from the charge pump 6. The frequency-multiplied clock has a frequency that is n-times as large as that of the reference clock. As shown in FIG. 9, the delay unit 34 is comprised of a plurality of multiplexers 35 connected in series, the number of multiplexers 35 being even. A selection control signal from the register 19 is applied to an input of each group of two multiplexers 35 except the two multiplexers 35 that are the closest to the input terminal 11. It is desirable that the plurality of multiplexers 35 are manufactured in the same semiconductor process that the plurality of multiplexers 33 for use in the VCO 36 are manufactured.

Next, a description will be made as to the operation of the delay circuitry of the sixth embodiment, assuming that the VCO 36 of the PLL 9 is comprised of five multiplexers 33 and the oscillator 4 generates a reference clock having a pulse repetition period of 25 nsec, i.e., having a frequency of 40 MHz. When the PLL 9 receives the reference clock, the charge pump 6 of the PLL 9 compares the phase of the reference clock with that of the frequency-divided clock from the frequency divider 3. The charge pump 6 changes the voltage of the control signal to be furnished to the VCO 36 according to the comparison result. The charge pump 6 increases the voltage of the control signal when the phase of the frequency-divided clock leads that of the reference clock, and decreases the voltage of the control signal otherwise. The time delay provided by each of the plurality of multiplexers 33 of the VCO 36 thus decreases with decrease in the voltage of the control signal, and hence increases with increase in the voltage of the control signal. As a result, when the phase of the frequency-divided clock leads that of the reference clock, the pulse repetition period of the frequency-multiplied clock increases since the time delay provided by each of the plurality of multiplexers 33 increases. In contrast, when the phase of the reference clock leads that of the frequency-divided clock, the pulse repetition period of the frequency-multiplied clock decreases since the time delay provided by each of the plurality of multiplexers 33 decreases. When the reference clock is made to be in phase with the frequency-divided clock, the PLL 9 brings itself into its locked state. When the PLL 9 is held in its locked state, the frequency-divided clock that is obtained by frequency-dividing the frequency-multiplied clock by n by means of the frequency divider 3 has the same pulse repetition period as the reference clock. At that time, the frequency-multiplied clock generated by the VCO 36 has a pulse repetition period of (25/n) nsec. For example, when the frequency divider 3 divides the frequency of the frequency-multiplied clock applied thereto by 20, the frequency-multiplied clock generated by the VCO 36 has a pulse repetition period of 1.25 nsec.

The control signal furnished by the charge pump 6 of the PLL 9 is applied to the control terminal of each of the plurality of multiplexers 35 of the delay unit 34 as well as to the control terminal of each of the plurality of multiplexers 33 of the VCO 36, as shown in FIG. 9. The time delay provided by each of the plurality of multiplexers 35 is thus controlled by the PLL 9. When the PLL 9 brings itself into its locked state, the frequency-divided clock, which has been obtained by frequency-dividing the frequency-multiplied clock generated by the VCO 36, is made to be in phase with the reference clock. The pulse repetition period of the frequency-multiplied clock becomes (25/n) nsec when the pulse repetition period of the reference clock generated by the oscillator 4 is 25 nsec for example. As a result, the time delay provided by each of the plurality of multiplexers 33 of the VCO 36 is fixedly set to a predetermined value. Also, the time delay provided by each of the plurality of multiplexers 35 of the delay unit 34 is fixedly set to the predetermined value under control of the PLL 9.

For example, when the frequency divider 3 divides the frequency of the frequency-multiplied clock from the VCO 36 by 20, the pulse repetition period of the frequency-multiplied clock generated by the VCO 36 becomes 1.25 nsec. When the VCO 36 is comprised of five multiplexers 33, the time delay provided by each of the plurality of multiplexers 33 becomes 0.25 nsec. Similarly, the time delay provided by each of the plurality of multiplexers 35 of the delay unit 34 becomes 0.25 nsec. Accordingly, when the delay unit 34 is comprised of 2 N multiplexers 35, the delay unit 34 provides an input signal applied thereto by way of the input terminal 11 with a time delay in the range of 0.5 to (0.5×N) nsec, the time delays being set in increments of 0.5 nsec. In other words, the smallest change in the time delay to be provided to the input signal applied to the input terminal 11 by the delay unit 34 corresponds to the time delay provided by each group of two multiplexers 35. One of the two multiplexers 35 included in each group, except the group that is the closest to the input terminal 11, is controlled according to information written into the register 19. If one, on the side of the input terminal 11, of the group of two multiplexers 35 that is the closest to the output terminal 13 is controlled so as to select the input signal applied to the input terminal 11 according to the contents of the register 19, the delay unit 34 provides the input signal with a certain time delay of 0.5 nsec.

As previously mentioned, in accordance with the sixth embodiment, by controlling the delay unit 34, which can provide an input signal with a time delay, by using the register 19, the time delay being set in increments of a time step whose value is controlled by the PLL 9, the delay circuitry can provide the input signal with the time delay in the range of a minimum time delay corresponding to the time step to a predetermined time delay. Accordingly, the delay circuitry 41 of FIG. 9 can precisely control the time delay in steps of the predetermined time step, e.g., 0.5 nsec. Even though the time delay provided by the delay unit 34 varies due to a change in the ambient temperature or a change in the voltage of a power supply, the same change occurs in the PLL 9 to make the PLL 9 operate to reduce the phase difference caused by the change between the phases of the frequency-multiplied clock generated by the PLL 9 and reference clock to zero, and therefore the time delay provided to the input signal by the delay unit 34 immediately, easily return to the desired set value. Furthermore, since the plurality of multiplexers 35 of the delay unit 34 are manufactured in the same semiconductor process that the plurality of multiplexers 33 included in the PLL 9 are manufactured, variations in the manufacturing process do not cause a change in the time delay from the desired set value.

Seventh Embodiment

Figure 10:
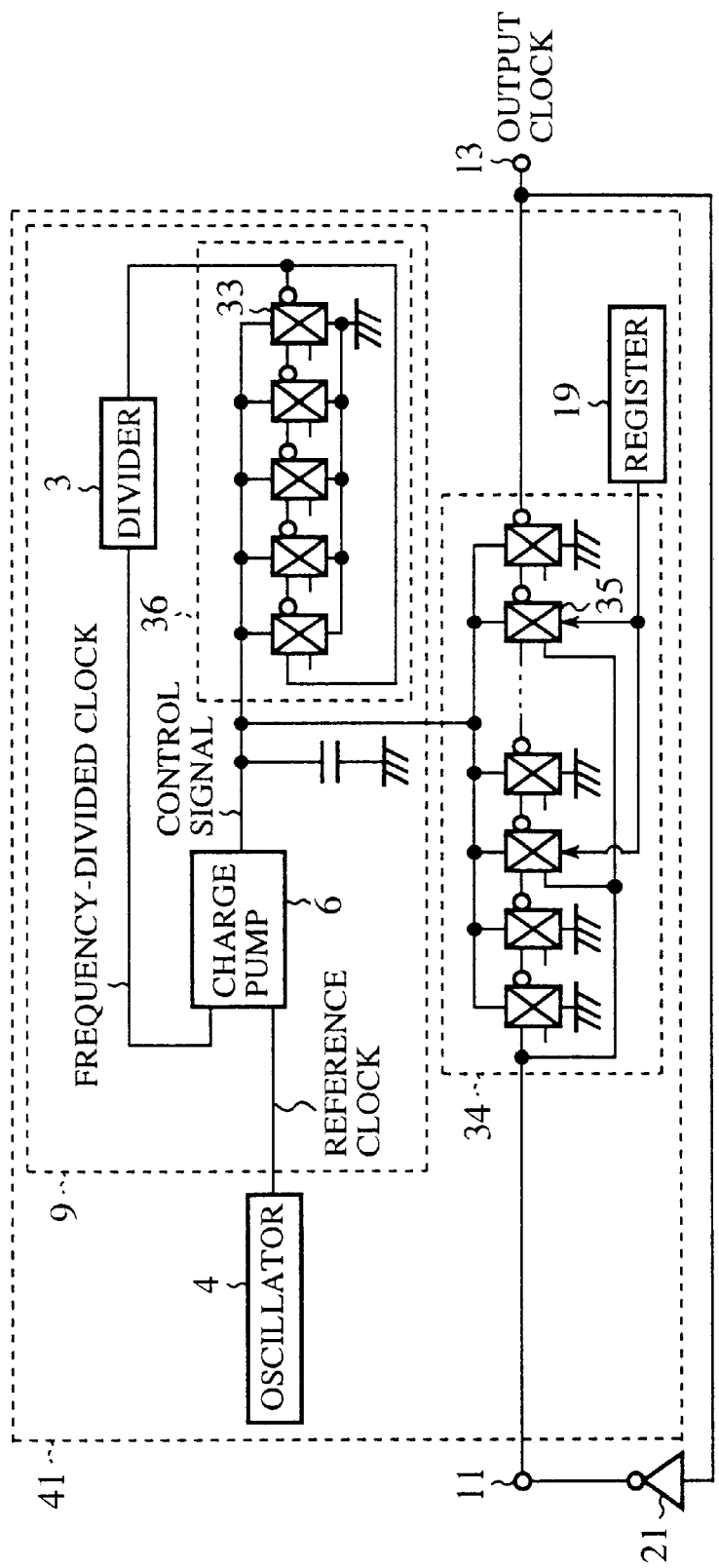
FIG. 10 is a block diagram showing the structure of clock generating circuitry according to a seventh embodiment of the present invention.

Referring next to FIG. 10, there is illustrated a block diagram showing the structure of clock generating circuitry according to a seventh embodiment of the present invention. In the figure, the same reference numerals as shown in FIG. 9 designate the same components as those of the delay circuitry according to the aforementioned sixth embodiment, and therefore the description of the components will be omitted hereinafter. As can be seen from FIG. 10, the clock generating circuitry of the seventh embodiment includes delay circuitry 41 according to the aforementioned sixth embodiment. In FIG. 10, reference numeral 21 denotes an inverter that connects an output terminal 13 of the delay circuitry 18 with an input terminal 11 of the delay circuitry to constitute a loop. As shown in FIG. 10, a VCO 36 of a PLL 9 includes five multiplexers 33. However, the number of multiplexers 33 included in the VCO 36 is not limited to five.

Next, a description will be made as to the operation of the clock generating circuitry of the seventh embodiment, assuming that the VCO 36 of the PLL 9 is comprised of five multiplexers 33 and an oscillator 4 generates a reference clock having a pulse repetition period of 25 nsec, i.e., having a frequency of 40 MHz. The delay circuitry 41 operates in the same manner as that of the sixth embodiment. That is, when the PLL 9 receives a reference clock, a charge pump 6 of the PLL 9 compares the phase of the reference clock with that of a frequency-divided clock from a frequency divider 3. The charge pump 6 changes the voltage of a control signal to be furnished to the VCO 36 according to the comparison result so that the frequency-divided clock is made to be in phase with the reference clock. When the reference clock is made to be in phase with the frequency-divided clock, the PLL 9 brings itself into its locked state. When the PLL 9 is held in its locked state, the frequency-divided clock that is obtained by frequency-dividing the frequency-multiplied clock by n by means of the frequency divider 3 has the same pulse repetition period as the reference clock. At that time, the frequency-multiplied clock generated by the VCO 36 has a pulse repetition period of (25/n) nsec. For example, when the frequency divider 3 divides the frequency of the frequency-multiplied clock applied thereto by 20, the frequency-multiplied clock generated by the VCO 36 has a pulse repetition period of 1.25 nsec.

The control signal furnished by the charge pump 6 of the PLL 9 is applied to the control terminal of each of the plurality of multiplexers 35 of the delay unit 34 as well as to the control terminal of each of the plurality of multiplexers 33 of the VCO 36, as shown in FIG. 10. The time delay provided by each of the plurality of multiplexers 35 is thus controlled by the PLL 9. When the PLL 9 brings itself into its locked state, the frequency-divided clock, which has been obtained by frequency-dividing the frequency-multiplied clock generated by the VCO 36, is made to be in phase with the reference clock. The pulse repetition period of the frequency-multiplied clock becomes (25/n) nsec when the pulse repetition period of the reference clock generated by the oscillator 4 is 25 nsec for example. As a result, the time delay provided by each of the plurality of multiplexers 33 of the VCO 36 is fixedly set to a predetermined value. Also, the time delay provided by each of the plurality of multiplexers 35 of the delay unit 34 is fixedly set to the predetermined value under control of the PLL 9.

For example, when the frequency divider 3 divides the frequency of the frequency-multiplied clock from the VCO 36 by 20, the time delay provided by each of the plurality of multiplexers 35 in the delay unit 34 becomes 0.25 nsec. Accordingly, when the delay unit 34 is comprised of 2 N multiplexers 35, the delay unit 34 provides an input signal applied thereto by way of the input terminal 11 with a time delay in the range of 0.5 to (0.5×N) nsec, the time delay being set in increments of 0.5 nsec. In other words, the smallest change (or time step) in the time delay to be provided to an input signal applied to the input terminal 11 by the delay unit 34 corresponds to the time delay provided by each group of two multiplexers 35. One of the two multiplexers 35 included in each group, except the group of two multiplexers 35 that is the closest to the input terminal 11, is controlled according to information written into the register 19. Accordingly, the clock generating circuitry according to the seventh embodiment can precisely change the pulse repetition period of an output clock from the basic pulse repetition period to (the basic pulse repetition period +0.5×(N−1)) in steps of 0.5 nsec according to the contents of the register 19. The basic pulse repetition period of the output clock is equal to the sum of the time delay caused by the inverter and 0.5 nsec.

As previously mentioned, in accordance with the seventh embodiment, the clock generating circuitry can precisely change the pulse repetition period of an output clock in steps of a predetermined time step by delaying an input clock by a time delay in the range of a minimum time delay corresponding to the predetermined time step to a certain time delay, the time delay being set in increments of the time step, using the delay unit 34 that is controlled by the PLL 9. Even though the time delay provided by the delay unit 34 in the delay circuitry 41 varies due to a change in the ambient temperature or a change in the voltage of a power supply, the same change occurs in the PLL 9 to make the PLL 9 operate to reduce the phase difference caused by the change between the phases of the frequency-multiplied clock generated by the PLL 9 and reference clock to zero, and therefore the pulse repetition period of the output clock defined by the delay circuitry 41 immediately, easily return to the desired set value. Furthermore, since the plurality of multiplexers 35 of the delay unit 34 are manufactured in the same semiconductor process that the plurality of multiplexers 33 included in the PLL 9 are manufactured, variations in the manufacturing process do not cause a change in the pulse repetition period of the output clock from the desired set value.

Eighth Embodiment

Figure 11:
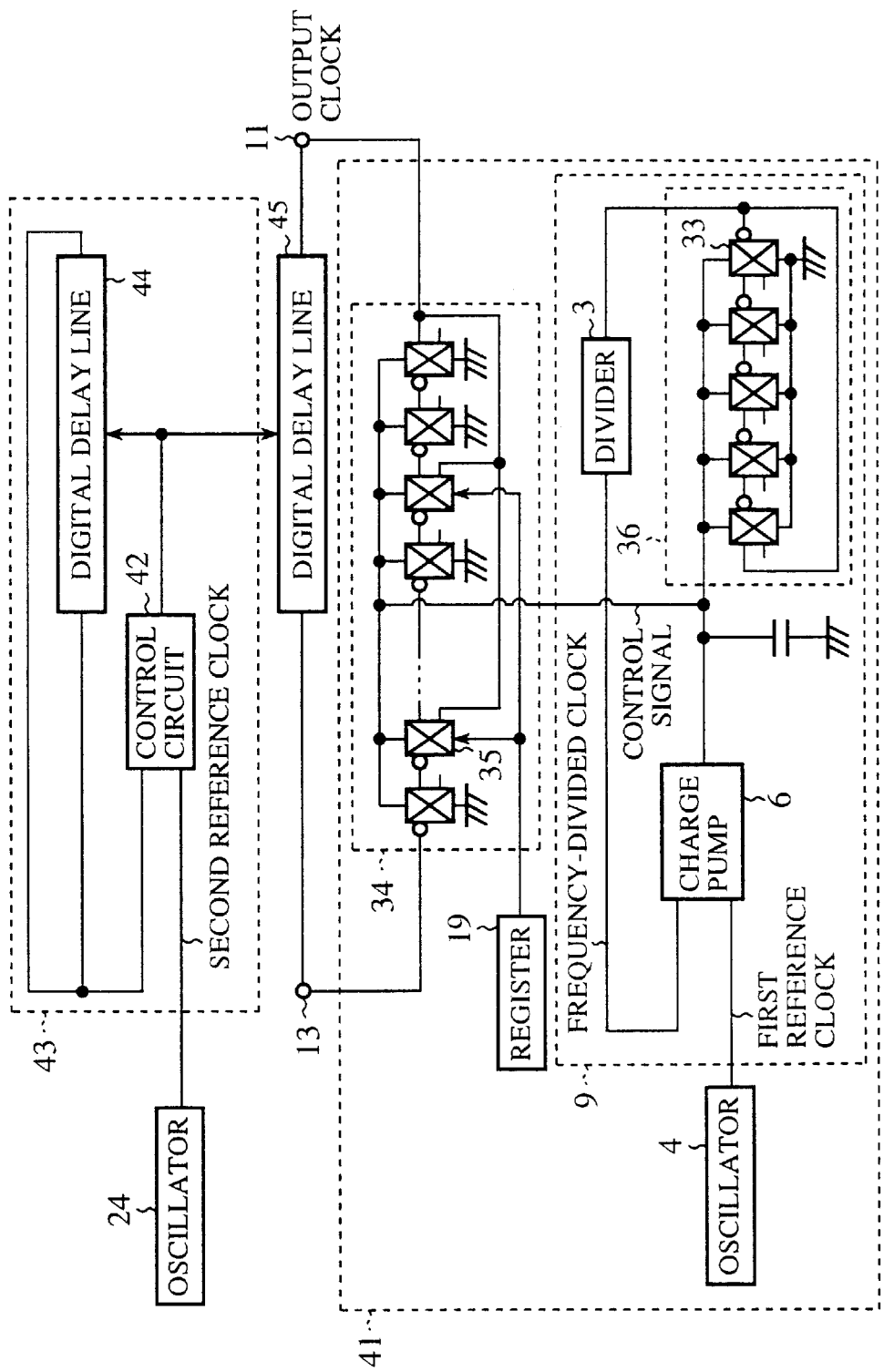
FIG. 11 is a block diagram showing the structure of clock generating circuitry according to an eighth embodiment of the present invention.

Referring next to FIG. 11, there is illustrated a block diagram showing the structure of clock generating circuitry according to an eighth embodiment of the present invention. In the figure, the same reference numerals as shown in FIG. 9 designate the same components as those of the delay circuitry according to the aforementioned sixth embodiment, and therefore the description of the components will be omitted hereinafter. As can be seen from FIG. 11, the clock generating circuitry of the eighth embodiment includes delay circuitry 41 according to the aforementioned sixth embodiment. In FIG. 11, reference numeral 24 denotes an oscillator for generating a second reference clock, 42 denotes a control circuit for comparing the phase of the second reference clock with that of an output of a digital delay line 44 so as to furnish a control signal having a value corresponding to the difference between the phases of the second reference clock and output of the digital delay line 44, thus defining the time delay to be provided by the digital delay line 44, and for determining the frequency multiplication ratio of a frequency-multiplied clock generated by the digital delay line 44 using a counter not shown, 43 denotes a digital PLL comprised of the control circuit 42 and digital delay line 44, 45 denotes a digital delay line connected between output and input terminals 13 and 11 of the delay circuitry 41, for providing an input signal with a time delay that is controlled by the control signal from the control circuit 42 of the digital PLL 43. The time delay provided by the digital delay line 45 is equal to that provided by the digital delay line 44. In other words, the time delay provided by the digital delay line 45 has a value equal to that of the pulse repetition period of the frequency-multiplied clock generated by the digital PLL 43. The digital PLL 43 generates a frequency-multiplied clock whose frequency is m-times as large as the second reference clock. It is desirable that the digital delay line 45 is manufactured under the same condition that the digital delay line 44 for use in the digital PLL 43 is manufactured.

Next, a description will be made as to the operation of the clock generating circuitry of the eighth embodiment, assuming that the VCO 36 of the PLL 9 in the delay circuitry 41 is comprised of five multiplexers 33, the delay unit 34 is comprised of 2 N multiplexers 35, an oscillator 4 in the delay circuitry generates a first reference clock having a pulse repetition period of 25 nsec, i.e., having a frequency of 40 MHz, and the oscillator 24 generates a second reference clock having a pulse repetition period of 20 nsec, i.e., having a frequency of 50 MHz. Since the delay circuitry 41 operates in the same manner as that of the aforementioned sixth embodiment, the description of the operation of the delay circuitry 41 will be omitted hereinafter.

Like the PLL 9 of the delay circuitry 41, when the digital PLL 43 receives the second reference clock, the control circuit 42 of the digital PLL 43 compares the phase of the second reference clock with that of the frequency-multiplied clock from the digital delay line 44. The frequency-multiplied clock has a frequency that is m-times as large as that of the second reference clock. The control circuit 42 changes the voltage of a control signal to be furnished to the digital delay line 44 according to the comparison result so that the frequency-multiplied clock is made to be in phase with the second reference clock. When the second reference clock is made to be in phase with the frequency-multiplied clock, the digital PLL 43 brings itself into its locked state. When the digital PLL 43 is held in its locked state, the frequency-multiplied clock generated by the digital delay line 44 has a pulse repetition period of (20/m) nsec. For example, when the digital delay line 44 generates the frequency-multiplied clock whose frequency is twice as large as that of the second reference clock, the frequency-multiplied clock has a pulse repetition period of 10 nsec.

The control signal furnished by the control circuit 42 of the digital PLL 43 is applied to a control terminal of the digital delay line 45 as well as to a control terminal of the digital delay line 44, as shown in FIG. 11. The time delay to be provided to an input signal by the digital delay line 45 is thus controlled by the control circuit 42. When the digital PLL 43 brings itself into its locked state, the frequency-multiplied clock generated by the digital delay line 44 is made to be in phase with the second reference clock. The pulse repetition period of the frequency-multiplied clock becomes (20/m) nsec when the pulse repetition period of the second reference clock generated by the oscillator 24 is 20 nsec for example. As a result, the time delay provided by the digital delay line 44 is fixedly set to a predetermined value. Also, the time delay provided by the digital delay line 45 is fixedly set to the predetermined value under control of the control circuit 42. For example, when the digital delay line 44 generates the frequency-multiplied clock whose frequency is twice as large as that of the second reference clock, the pulse repetition period of the frequency-multiplied clock is 10 nsec.

On the other hand, when the frequency divider 3 in the delay circuitry 41 divides the frequency of the frequency-multiplied clock from the VCO 36 by 20, the time delay provided by each of the plurality of multiplexers 35 of the delay unit 34 becomes 0.25 nsec, as previously explained in Sixth Embodiment. Accordingly, when the delay unit 34 is comprised of 2 N multiplexers 35, the delay unit 34 provides an input signal applied thereto by way of the input terminal 11 with a time delay in the range of 0.5 to (0.5×N) nsec, the time delay being set in increments of 0.5 nsec. Accordingly, the clock generating circuitry according to the eighth embodiment can precisely change the pulse repetition period of an output clock from the basic pulse repetition period to (the basic pulse repetition period +0.5×(N−1)) nsec in steps of 0.5 nsec according to the contents of a register 19. In the example shown, the basic pulse repetition period of the output clock is 10.5 nsec.

Preferably, the first and second reference clocks are equal in frequency. For example, when the first and second oscillators 4 and 24 generate first and second reference clocks having an equal repetition period of 25 nsec (i.e., of equal frequency of 40 MHz), the frequency divider 3 divides the frequency of the frequency-multiplied clock from the VCO 36 by 20, and the digital delay line 44 generates the frequency-multiplied clock whose frequency is equal to that of the second reference clock, the clock generating circuitry can precisely control the pulse repetition period of the output clock according to the contents of the register 19 so that it ranges from 25.5 nsec to (25+(0.5×N)} nsec in steps of 0.5 nsec.

As previously mentioned, in accordance with the eighth embodiment, the clock generating circuitry can precisely maintain the basic pulse repetition period of an output clock by means of the digital delay line 45, which is controlled by the digital PLL 43, and precisely change the pulse repetition period of the output clock in steps of a predetermined time step by delaying an input signal by a time delay in the range of a minimum time delay corresponding to the time step to a certain time delay, the time delay being set in increments of the time step, using the delay unit 34, which is controlled by the PLL 9. Even though the basic pulse repetition period of the output clock defined by the digital delay line 45 varies due to a change in the ambient temperature or a change in the-voltage of a power supply, the same change occurs in the digital PLL 43 to make the digital PLL 43 operate to reduce the phase difference caused by the change between the phases of the frequency-multiplied clock generated by the digital PLL 43 and reference clock to zero, and therefore the basic pulse repetition period of the output clock defined by the digital delay line 45 immediately, easily return to the desired set value. Even though the time delay provided by the delay unit 34 in the delay circuitry 41 varies due to a change in the ambient temperature or a change in the voltage of a power supply, the same change occurs in the PLL 9 to make the PLL 9 operate to reduce the phase difference caused by the change between the phases of the frequency-multiplied clock generated by the PLL 9 and reference clock to zero, and therefore the pulse repetition period of the output clock defined by the delay circuitry 41 immediately, easily return to the desired set value. Furthermore, since the digital delay line 45 is manufactured under the same condition that the digital delay line 44 is manufactured, variations in the manufacturing process do not cause a change in the basic pulse repetition period of the output clock from the desired set value.

Ninth Embodiment

Figure 12:
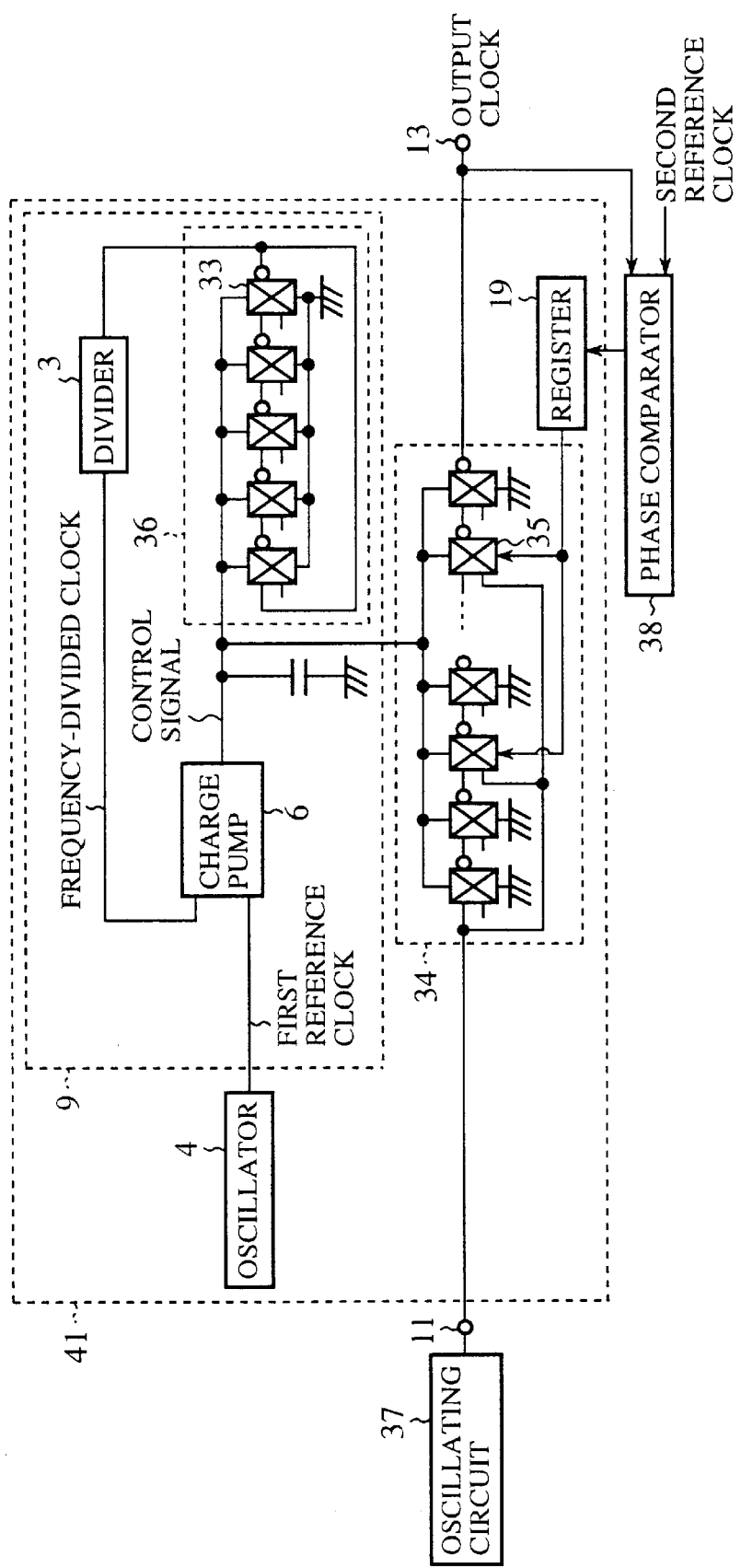
FIG. 12 is a block diagram showing the structure of phase synchronization circuitry according to a ninth embodiment of the present invention.
Figure 13:
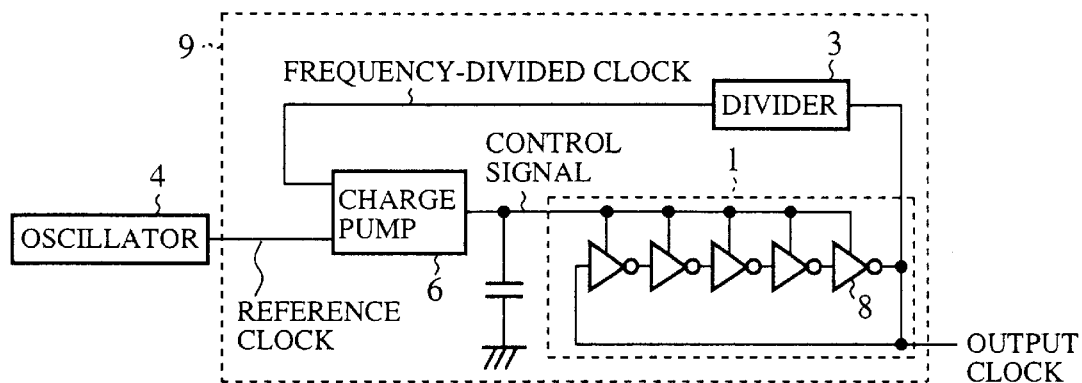
FIG. 13 is a block diagram showing the structure of prior art clock generating circuitry.
Figure 14:
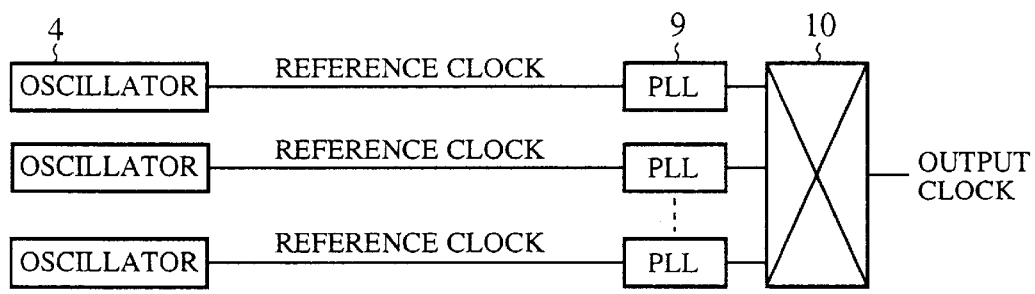
FIG. 14 is a block diagram showing the structure of an example of other prior art clock generating circuitry capable of switching between output clocks having different pulse repetition periods.
Figure 15:
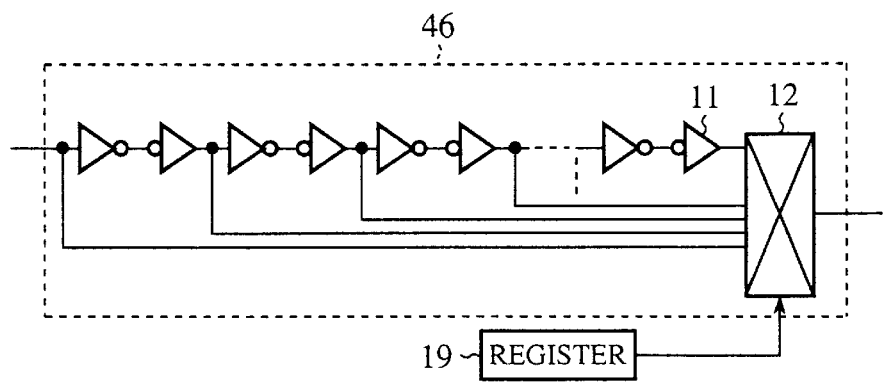
FIG. 15 is a block diagram showing the structure of an example of prior art delay circuitry capable of adjusting a time delay that the circuitry provides for an input.
Figure 16:
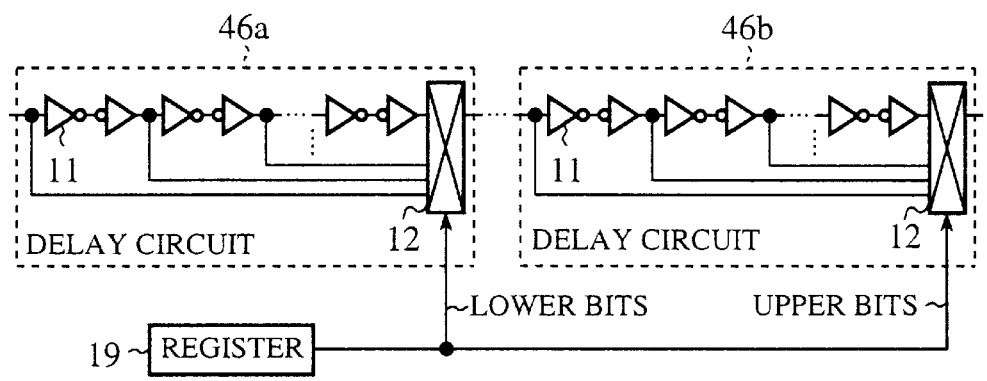
FIG. 16 is a block diagram showing the structure of another example of prior art delay circuitry capable of adjusting a time delay that the circuitry provides for an input.
Figure 17:
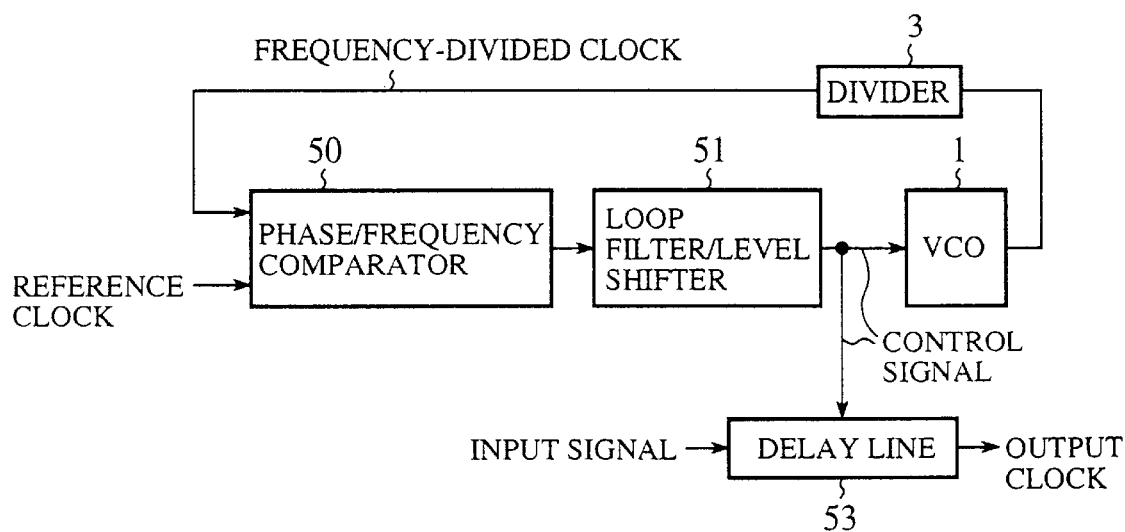
FIG. 17 is a block diagram showing the structure of another example of prior art delay circuitry.

Referring next to FIG. 12, there is illustrated a block diagram showing the structure of phase synchronization circuitry according to a ninth embodiment of the present invention. In the figure, the same reference numerals as shown in FIG. 9 designate the same components as those of the delay circuitry according to the aforementioned sixth embodiment, and therefore the description of the components will be omitted hereinafter. As can be seen from FIG. 12, the phase synchronization circuitry of the ninth embodiment includes delay circuitry 41 according to the aforementioned sixth embodiment. In FIG. 12, reference numeral 37 denotes an oscillator for generating a clock having a predetermined pulse repetition period. The oscillator 37 can consist of a PLL. As an alternative, the oscillator 37 can be clock generating circuitry according to the aforementioned second or third embodiment. The oscillator 37 can alternatively be clock generating circuitry according to the aforementioned seventh or eighth embodiment. Further, in FIG. 12, reference numeral 38 denotes a phase comparator for comparing the phase of a second reference clock applied thereto with that of an output clock of the delay circuitry 41 and for furnishing a control signal having a value corresponding to the phase difference between the phases of the second reference clock and output clock of the delay circuitry to a register 19 to change the contents of the register 19 so that the phase difference becomes zero.

Next, a description will be made as to the operation of the phase synchronization circuitry of the ninth embodiment, assuming that the VCO 36 of the PLL 9 in the delay circuitry 41 is comprised of five multiplexers 33 and an oscillator 4 generates a first reference clock having a pulse repetition period of 25 nsec, i.e., having a frequency of 40 MHz. Since the delay circuitry 41 operates in the same manner as that of the sixth embodiment, the description of the operation of the delay circuitry will be omitted hereinafter.

When the frequency divider 3 of the delay circuitry 41 divides the frequency of the frequency-multiplied clock applied thereto from the VCO 36 by 20, the time delay provided by each of the plurality of multiplexers 35 in the delay unit 34 becomes 0.25 nsec, as previously mentioned in Sixth Embodiment. Accordingly, when the delay unit 34 is comprised of 2 N multiplexers 35, the delay unit 34 provides an input signal applied thereto with a time delay in the range of 0.5 to (0.5×N) nsec, the time delay being set in increments of 0.5 nsec. In other words, the smallest change (or time step) in the time delay to be provided to the input signal applied to the input terminal 11 by the delay unit 34 corresponds to the time delay provided by each group of two multiplexers 35. One of the two multiplexers 35 included in each group, except the group of two multiplexers 35 that is the closest to the input terminal 11, is controlled according to information written into the register 19. If one, on the side of the input terminal 11, of the group of two multiplexers 35 that is the closest to the output terminal 13 is controlled so as to select the input signal applied to the input terminal 11 according to the contents of the register 19, the delay unit 34 provides the input signal with a certain time delay of 0.5 nsec.

When making the output clock of the oscillator 37 be in phase with the other clock, i.e., the second reference clock, the phase comparator 38 compares the phase of the second reference clock applied thereto with that of the output clock of the delay circuitry 41 and then furnishes a control signal having a value corresponding to the phase difference to the register 19 to change the contents of the register 19 so that the phase difference becomes zero. In other words, when the output clock leads the second reference clock, the phase comparator 38 changes the contents of the register 19 so that the number of multiplexers 35 through which the output clock will be passed in the delay unit 34 is increased. Otherwise, the phase comparator 38 changes the contents of the register 19 so that the number of multiplexers 35 through which the output clock will be passed in the delay unit 34 is decreased. When the frequency divider 3 of the delay circuitry 41 divides the frequency of the frequency-multiplied clock from the VCO 36 by 20, the phase comparator can change the contents of the register 19 to change the phase of the output clock by a time delay in the range of 0.5 to (0.5×N) nsec in steps of 0.5 nsec, thus being able to make the output clock be in phase with the second reference clock. Accordingly, when the output clock is used as an internal reference clock for use with a semiconductor circuit, the AC characteristic of the semiconductor circuit can be controlled using the register 19.

As previously mentioned, in accordance with the ninth embodiment, the phase synchronization circuitry can precisely change the phase of an output clock in steps of a predetermined time step by delaying an input clock by a time delay in the range of a minimum time delay corresponding to the time step to a certain time delay, the time delay being set in increments of the time step, using the delay unit 34, which is controlled by the PLL 9, thus being able to bring the output clock into synchronization with another clock as needed. Even though the time delay provided by the delay unit 34 in the delay circuitry 41 varies due to a change in the ambient temperature or a change in the voltage of a power supply, the same change occurs in the PLL 9 to make the PLL 9 operate to reduce the phase difference caused by the change between the phases of the frequency-multiplied clock generated by the PLL 9 and reference clock to zero, and therefore the phase shift to be provided to the input clock, which is defined by the delay circuitry 41, immediately, easily return to the desired set value. Furthermore, since the plurality of multiplexers 35 of the delay unit 34 are manufactured in the same semiconductor process that the plurality of multiplexers 33 included in the VCO 36 are manufactured, variations in the manufacturing process do not cause a change in the phase shift provided for the input clock from the desired set value.

Many widely different embodiments of the present invention may be constructed without departing from the spirit and scope of the present invention. It should be understood that the present invention is not limited to the specific embodiments described in the specification, except as defined in the appended claims.

What is claimed is:

1. Delay circuitry comprising:
    phase locked loop means for comprising a phase of a reference clock applied thereto with that of another clock to be compared to generate a control signal having a value corresponding to a phase difference between the phases of the reference clock and the another clock, for generating the another clock using at least a plurality of first delay elements connected into a loop, a time delay provided by each of the plurality of first delay elements being controlled by the control signal, and for changing the value of the control signal so that the another clock is made to be in phase with the reference clock;
    storage means for storing information to set a predetermined time delay; and
    delay means, connected to said storage means, and including a plurality of second delay elements each of which provides an input with a time delay that is controlled by the control signal from said phase locked loop means, for determining the number of second delay elements through which an input signal is to be passed according to the information stored in said storage means, so as to provide the input signal with the predetermined time delay.

2. The delay circuitry according to claim 1, wherein said plurality of first delay elements included in said phase locked loop means are manufactured in the same semiconductor process that said plurality of second delay elements included in said delay means are manufactured.

3. The delay circuitry according to claim 1, wherein said delay circuitry further comprises a plurality of delay circuits connected in series, each of which includes said phase locked loop means, said storage means, and said delay means, and each of said plurality of delay circuits can change the predetermined delay time to be provided to an input applied thereto in steps of a different time step.

4. The delay circuitry according to claim 3, wherein in each of said plurality of delay circuits, said plurality of delay elements included in said oscillating means are manufactured in the same semiconductor process that said plurality of delay elements included in said delay means are manufactured.

5. Clock generating circuitry comprising:
    at least a delay circuit including phase locked loop means for comprising a phase of a reference clock applied thereto with that of another clock to be compared to generate a control signal having a value corresponding to a phase difference between the phases of the reference clock and the another clock, for generating the another clock using at least a plurality of firs delay elements connected into a loop, a time delay provided by each of the plurality of first delay elements being controlled by the control signal, and for changing the value of the control signal so that the another clock is made to be in phase with the reference clock, storage means for storing information to set a predetermined time delay, and delay means connected to said storage means and including a plurality of second delay elements each of which provides an input with a time delay that is controlled by the control signal from said phase locked loop means, for determining the number of second delay elements through which an input signal is to be passed according to the information stored in said storage means, so as to provide the input signal with the predetermined time delay; and
    clock generating means that forms a loop together with at least said delay circuit, for generating and furnishing a clock pulse having a certain basic pulse repetition period to said delay circuit, and for generating a clock having a predetermined pulse repetition period in cooperation with said delay circuit.

6. The clock generating circuitry according to claim 5, wherein said plurality of first delay elements included in said phase locked loop means are manufactured in the same semiconductor process that said plurality of second delay elements included in said delay means are manufactured.

7. The clock generating circuitry according to claim 5, wherein said clock generating circuitry further comprises a plurality of delay circuits connected in series, each of which includes the phase locked loop means for comparing the phase of the reference clock applied thereto with that of another clock to be compared to generate the control signal having the value corresponding to the phase difference between the phases of the reference clock and the another clock, for generating the another clock using at least the plurality of first delay elements connected into a loop, the time delay provided by each of the plurality of first delay elements being controlled by the control signal, and for changing the value of the control signal so that the another clock is made to be in phase with the reference clock, storage means for storing information to set the predetermine time delay, and the delay means including the plurality of second delay elements each of which provides the input with the time delay that is controlled by the control delay elements said phase locked loop means, for determine the number of second delay elements through which the input signal is to be passed according to the information stored in said storage means, so as to provide the input signal with the predetermined time delay, each of said plurality of delay circuits being able to change a certain time delay to be provided to an input applied thereto in steps of a different time step, and wherein said plurality of delay circuits form a loop together with said clock generating means.

8. The clock generating circuitry according to claim 7, wherein in each of said plurality of delay circuits, said plurality of first delay elements included in said phase locked loop means are manufactured in the same semiconductor process that said plurality of second delay elements included in said delay means are manufactured.

9. The clock generating circuitry according to claim 5, wherein said clock generating means is a means for inverting an output of said delay circuit that forms the loop together with said clock generating means so as to generate the clock having the predetermined pulse repetition period in cooperation with said delay circuit.

10. The clock generating circuitry according to claim 7, wherein said cock generating means is a means for inverting an output of one of said plurality of delay circuits in series that form the loop together with said clock generating means so as to generate the clock having the predetermined pulse repetition period in cooperation with said plurality of delay circuits.

11. The clock generating circuitry according to claim 5, wherein said clock generating circuitry further includes control means for comparing a phase of a reference clock applied thereto with that of another clock to be compared to generate a control signal having a value corresponding to a phase difference between the phases of the reference clock and the another clock, for generating the another clock using first delay means formed into a loop, a time delay provided by said first delay means being controlled by the control signal, and for changing the value of the control signal so that another clock is made to be in phase with the reference clock, and second delay means for inverting an output of said delay circuit that forms the loop together with said clock generating means and for providing the output with a time delay control by control signal from said control means so as to generate the clock having the predetermined pulse repetition period in cooperation with said delay circuit.

12. The clock generating circuitry according to claim 7, wherein said clock generating circuitry further includes control means for comparing a phase of a reference clock applied thereto with that of another clock to be compared to generate a control signal having a value corresponding to a phase difference between the phases of the reference clock and the another clock, for generating the another clock using first delay means formed into a loop, a time delay provide by said first delay means being controlled by the control signal, and for changing the value of the control signal so that the another clock is made to be in phase with the reference clock, and second delay means for inverting an output of one of said plurality of delay circuits in series that form the loop together with said clock generating means and for providing the output with a time delay controlled by the control signal from said control means so as to generate the clock having the predetermined pulse repetition period in cooperation with said plurality of delay circuits.

13. The clock generating circuitry according to claim 11, wherein said control means includes a plurality of third delay elements connected in series, which are disposed as said first delay means formed into a loop, a time delay provided by each of said plurality of third delay elements being controlled by the control signal, and wherein said second delay means of said clock generating means includes a plurality of fourth delay elements connected in series, a time delay provided by each of said plurality of fourth delay elements being controlled by the control signal from said control means.

14. The clock generating circuitry according to claim 13, wherein said plurality of third delay elements included in said control means are manufactured in the same semiconductor process that said plurality of fourth delay elements included in said second delay means of said clock generating means are manufactured.

15. The clock generating circuitry according to claim 11, wherein said control means includes a first digital delay line, which is disposed as said first delay means, a time delay provided by said first digital delay line being controlled by the control signal, and wherein said second delay means of said clock generating means includes a second digital delay line, a time delay provided by said second digital delay line being controlled by the control signal from said control means.

16. The clock generating circuitry according to claim 11, wherein the reference clock applied to at least said one of said first and second delay circuits has the same frequency as the reference clock applied to said clock generating means.

17. The clock generating circuitry according to claim 12, wherein the reference clock applied to at least one of said plurality of delay circuits has the same frequency as the reference clock applied to said clock generating means.

18. The clock generating circuitry according to claim 11, further comprising at least another delay circuit for adjusting the phase of the clock having the predetermined pulse repetition period from said clock generating means, said another delay circuit including the phase locked loop means for comprising the phase of the reference clock applied thereto with that of the another clock to be compared to generate the control signal having the value corresponding to the phase difference between the phases of the reference clock and the another clock, for generating the another clock using at least the plurality of first delay elements connected into the loop, the time delay provided by each of the plurality of first delay elements being controlled by the control signal, and for changing the value of the control signal so that the another clock is made to be in phase with the reference clock the storage means for storing information to set the predetermined time delay, and the delay means including the plurality of second delay elements each of which provides the input with the time delay that is controlled by the control signal from said phase locked loop means, for determining the number of second delay elements through which an input signal is to be passed according to the information stored in said storage means, so as to provide the clock from said clock generating means with the predetermined time delay.

19. Phase synchronization circuitry comprising:

phase locked loop means for comprising a phase of a first reference clock applied thereto with that of another clock to be compared to generate a control signal having a value corresponding to a phase difference between the phases of the first reference clock and the another clock, for generating the another clock using at least a plurality of first delay elements connected into a loop, a time delay provide by each of the plurality of first delay elements being controlled by the control signal, and for changing the value of the control signal so that the another clock is made to be in phase with the first reference clock;

storage means for storing information to set a predetermined time delay;

delay means including a plurality of second delay elements each of which provides an input with a time delay that is controlled by the control signal from said phase locked loop means, for changing the number of second delay elements through which an input clock signal is to be passed, so as to provide the input clock signal with the predetermined time delay; and phase synchronization means, connected to said storage means, for comparing the phase of a second reference clock applied to thereto with that of an output clock signal from said delay means, and for changing the information stored in said storage means so that the second reference clock is made to be in phase with the output clock signal.

20. The delay circuitry according to claim 19, wherein said plurality of first delay elements included in said phase locked loop means are manufactured in the same semiconductor process that said plurality of second delay elements included in said delay means are manufactured.

* * * * *